(12) United States Patent
Yonemura et al.

(10) Patent No.: US 11,927,649 B2
(45) Date of Patent: Mar. 12, 2024

(54) MAGNETORESISTANCE EFFECT ELEMENT

(71) Applicant: TDK CORPORATION, Tokyo (JP)

(72) Inventors: Shogo Yonemura, Tokyo (JP); Tomoyuki Sasaki, Tokyo (JP); Shinto Ichikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 269 days.

(21) Appl. No.: 17/194,694

(22) Filed: Mar. 8, 2021

(65) Prior Publication Data
US 2021/0318394 A1 Oct. 14, 2021

(30) Foreign Application Priority Data
Mar. 10, 2020 (JP) ................................ 2020-041166

(51) Int. Cl.
| | | |
|---|---|---|
| G01R 33/09 | (2006.01) | |
| G11B 5/39 | (2006.01) | |
| H10N 50/10 | (2023.01) | |
| H10N 50/80 | (2023.01) | |
| H10N 50/85 | (2023.01) | |

(52) U.S. Cl.
CPC ......... *G01R 33/093* (2013.01); *G01R 33/098* (2013.01); *G11B 5/3909* (2013.01); *H10N 50/10* (2023.02); *H10N 50/80* (2023.02); *H10N 50/85* (2023.02)

(58) Field of Classification Search
CPC ........... G01R 33/09–098; H10N 50/10; H10N 50/80–85; G11B 5/3909
USPC ....................................................... 257/40
See application file for complete search history.

(56) References Cited

U.S. PATENT DOCUMENTS

| | | | | |
|---|---|---|---|---|
| 7,738,220 B1* | 6/2010 | Fukuzawa | ............ | B82Y 10/00 360/324.12 |
| 8,085,511 B2* | 12/2011 | Yuasa | ................ | H01F 10/3272 360/324.11 |
| 8,760,818 B1* | 6/2014 | Diao | .................... | G11B 5/3143 360/313 |

(Continued)

FOREIGN PATENT DOCUMENTS

| | | |
|---|---|---|
| JP | 2003-060263 A | 2/2003 |
| JP | 5586028 B2 | 9/2014 |

(Continued)

OTHER PUBLICATIONS

Sukegawa et al.; "Tunnel magnetoresistance with improved bias voltage dependence in lattice-matched Fe/spinel MgAl2O4/Fe(001) junctions"; Applied Physics Letters; 2010; vol. 96; 212505-1-212505-3.

Miura et al.; "First-principles study of tunneling magnetoresistance in Fe/MgAl2O4/Fe(001) magnetic tunnel junctions"; Physical Review B; 2012; vol. 86; pp. 024426-1-024426-6.

(Continued)

*Primary Examiner* — Marcos D. Pizarro
(74) *Attorney, Agent, or Firm* — Oliff PLC

(57) ABSTRACT

A magnetoresistance effect element includes a first ferromagnetic layer, a second ferromagnetic layer, a nonmagnetic layer that is disposed between the first ferromagnetic layer and the second ferromagnetic layer, and an insertion layer that is disposed at least one of a position between the first ferromagnetic layer and the nonmagnetic layer and a position between the second ferromagnetic layer and the nonmagnetic layer, in which the nonmagnetic layer is composed of an oxide containing Mg and Ga, and the insertion layer is a ferromagnetic component containing Ga.

13 Claims, 7 Drawing Sheets

(56) References Cited

U.S. PATENT DOCUMENTS

| | | | |
|---|---|---|---|
| 8,922,953 B1* | 12/2014 | Childress | G11B 5/3912 |
| | | | 360/324 |
| 9,773,972 B1* | 9/2017 | Kim | H10N 50/10 |
| 2003/0168673 A1 | 9/2003 | Yuasa et al. | |
| 2012/0091548 A1 | 4/2012 | Sukegawa et al. | |
| 2013/0003579 A1 | 1/2013 | Lu et al. | |
| 2015/0255135 A1* | 9/2015 | Tran | H10N 50/85 |
| | | | 365/158 |
| 2017/0018703 A1* | 1/2017 | Freitag | H10N 50/01 |
| 2017/0077394 A1 | 3/2017 | Saida | |
| 2018/0068681 A1* | 3/2018 | Sasaki | H10B 61/22 |
| 2018/0090671 A1 | 3/2018 | Kato et al. | |
| 2018/0254409 A1 | 9/2018 | Nakada et al. | |
| 2020/0044144 A1 | 2/2020 | Sukegawa et al. | |
| 2020/0328344 A1* | 10/2020 | Saito | H10B 99/00 |

FOREIGN PATENT DOCUMENTS

| | | |
|---|---|---|
| JP | 5588019 B2 | 9/2014 |
| JP | 2017-059690 A | 3/2017 |
| JP | 2018-056272 A | 4/2018 |
| JP | 6365901 B2 | 8/2018 |
| JP | 2018-147998 A | 9/2018 |
| WO | 2016/158849 A1 | 10/2016 |
| WO | 2018/230466 A1 | 12/2018 |

OTHER PUBLICATIONS

Scheike et al.; "Lattice-matched magnetic tunnel junctions using a Heusler alloy $Co_2FeAl$ and a cation-disorder spinel Mg—Al—O barrier"; Applied Physics Letters; 2014; vol. 105; pp. 242407-1-242407-5.

* cited by examiner

MAGNETORESISTANCE EFFECT ELEMENT

BACKGROUND OF THE INVENTION

Field of the Invention

The present disclosure relates to a magnetoresistance effect element.

Priority is claimed on Japanese Patent Application 2020-041166, filed Mar. 10, 2020, the content of which is incorporated herein by reference.

Description of Related Art

A magnetoresistance effect element is an element that changes a resistance value in a lamination direction due to a magnetoresistance effect. The magnetoresistance effect element includes two ferromagnetic layers and a nonmagnetic layer inserted therebetween. A magnetoresistance effect element in which a conductor is used for a nonmagnetic layer is called a giant magnetoresistance (GMR) element, and a magnetoresistance effect element in which an insulating layer (tunnel barrier layer, barrier layer) is used as a nonmagnetic layer is called a tunnel magnetoresistance (TMR) element. Magnetoresistance effect elements can be applied to various applications such as magnetic sensors, high-frequency components, magnetic heads and non-volatile random-access memories (MRAMs).

Japanese Patent No. 6365901 describes a magnetoresistance effect element using a nonmagnetic layer containing $MgGa_2O_4$. Japanese Patent No. 6365901 describes that a nonmagnetic layer containing Ga has a reverse spinel structure and a low area resistance (RA).

SUMMARY OF THE INVENTION

With the demand for lower voltage and lower power consumption of magnetic recording media in recent years, there has been a demand for lower power consumption for magnetic heads. However, as in the magnetoresistance effect element described in Japanese Patent No. 6365901, even if the nonmagnetic layer contains Ga, RA may not be sufficiently reduced.

The present disclosure has been made in view of the above circumstances and an object of the present disclosure is to provide a magnetoresistance effect element having a small RA.

The inventors found that, in a magnetoresistance effect element using a nonmagnetic layer containing Ga, when Ga diffuses into other layers, RA is not sufficiently reduced. Therefore, the present disclosure provides the following aspects in order to address the above problem.

(1) A magnetoresistance effect element according to a first aspect includes a first ferromagnetic layer, a second ferromagnetic layer, a nonmagnetic layer that is disposed between the first ferromagnetic layer and the second ferromagnetic layer, and an insertion layer that is disposed at least one of a position between the first ferromagnetic layer and the nonmagnetic layer and a position between the second ferromagnetic layer and the nonmagnetic layer, wherein the nonmagnetic layer is composed of an oxide containing Mg and Ga, and wherein the insertion layer is a ferromagnetic component containing Ga.

(2) In the magnetoresistance effect element according to the above aspect (1), the nonmagnetic layer may be composed of an oxide containing Mg, Al, and Ga.

(3) In the magnetoresistance effect element according to the above aspect (1) or (2), the thickness of the insertion layer may be 2 nm or less.

(4) In the magnetoresistance effect element according to any one of the above aspects (1) to (3), the insertion layer, the first ferromagnetic layer, and the second ferromagnetic layer may contain at least one element selected from Co and Fe.

(5) In the magnetoresistance effect element according to any one of the above aspects (1) to (4), the insertion layer may contain a Heusler alloy containing Ga.

(6) In the magnetoresistance effect element according to the above aspect (5), the Heusler alloy may be an alloy represented by the following General Formula (1):

$$Co_2Fe_\alpha Ga_\beta Ge_\gamma \qquad (1)$$

(in Formula (1), $\alpha$, $\beta$ and $\gamma$ represent numbers that satisfy $2.3 \leq \alpha+\beta+\gamma$, $\alpha \leq \beta+\gamma$, and $0.5 < \alpha < 1.9$, $0.1 \leq \beta$, and $0.1 \leq \gamma$).

(7) The magnetoresistance effect element according to any one of the above aspects (1) to (6), may further include a metal particle layer that is disposed at least one of a position between the insertion layer and the first ferromagnetic layer and a position between the insertion layer and the second ferromagnetic layer, in which the metal particle layer may contain any one element selected from the group consisting of Ta, W, and Mo.

(8) In the magnetoresistance effect element according to the above aspect (7), the thickness of the metal particle layer may be 1 nm or less.

(9) In the magnetoresistance effect element according to any one of the above aspects (1) to (8), a Ga concentration of a first insertion layer disposed between the first ferromagnetic layer and the nonmagnetic layer and a Ga concentration of a second insertion layer disposed between the second ferromagnetic layer and the nonmagnetic layer may be lower than a Ga concentration of the nonmagnetic layer.

(10) The magnetoresistance effect element according to any one of the above aspects (1) to (9) may further include a magnetostriction-reducing layer that exhibits magnetostriction in a direction opposite to that of the insertion layer at any position in a lamination direction.

(11) In the magnetoresistance effect element according to the above aspect (10), the magnetostriction-reducing layer may be adjacent to the insertion layer.

The magnetoresistance effect element according to the present disclosure can reduce RA.

DETAILED DESCRIPTION OF THE INVENTION

Figure 1:
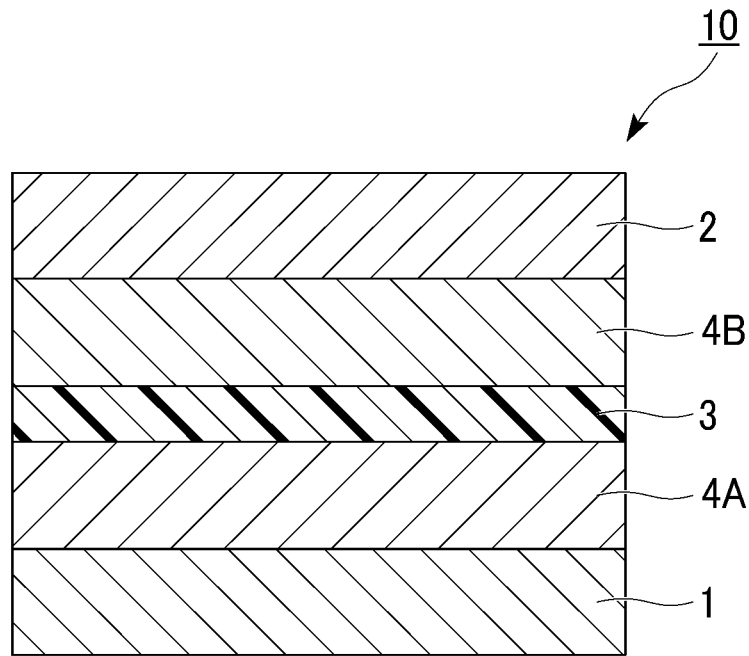
FIG. 1 is a cross-sectional view of a magnetoresistance effect element according to a first embodiment.

The present embodiment will be appropriately described below in detail with reference to the drawings. In the drawings used in the following description, in order to facilitate understanding of features of the present embodiment, feature parts are enlarged for convenience of illustration in some cases, and size ratios and the like between components may be different from those of actual components. Materials, sizes, and the like exemplified in the following description are examples not limiting the present disclosure, and they can be appropriately changed and implemented within a range not changing the scope and spirit of the disclosure. In addition, although the composition formula described in this specification is described as a stoichiometric composition, deviation from the stoichiometric composition is acceptable as long as the structure can be maintained.

First Embodiment

FIG. 1 is a cross-sectional view of a magnetoresistance effect element according to a first embodiment. First, directions will be defined. A direction in which layers are laminated may be referred to as a lamination direction. In addition, a direction which intersects the lamination direction and in which layers spread may be referred to as an in-plane direction.

A magnetoresistance effect element 10 shown in FIG. 1 includes a first ferromagnetic layer 1, a second ferromagnetic layer 2, a nonmagnetic layer 3 disposed between the first ferromagnetic layer 1 and the second ferromagnetic layer 2, a first insertion layer 4A disposed between the first ferromagnetic layer 1 and the nonmagnetic layer 3, and a second insertion layer 4B disposed between the second ferromagnetic layer 2 and the nonmagnetic layer 3.

That is, the nonmagnetic layer 3 is disposed between the first insertion layer 4A and the second insertion layer 4B. The first insertion layer 4A, the nonmagnetic layer 3 and the second insertion layer 4B are inserted between the first ferromagnetic layer 1 and the second ferromagnetic layer 2 in the lamination direction. Hereinafter, when the first ferromagnetic layer 1 and the second ferromagnetic layer 2 are not distinguished, they may simply be referred to as a ferromagnetic layer.

The magnetoresistance effect element 10 outputs a change in a relative angle between the magnetization of the first ferromagnetic layer 1 and the magnetization of the second ferromagnetic layer 2 as a resistance value change. The magnetization of the second ferromagnetic layer 2 changes more easily than the magnetization of the first ferromagnetic layer 1. When a predetermined external force is applied, the direction of the magnetization of the first ferromagnetic layer 1 does not change (is fixed), and the direction of the magnetization of the second ferromagnetic layer 2 changes. When the direction of the magnetization of the second ferromagnetic layer 2 changes with respect to the direction of the magnetization of the first ferromagnetic layer 1, the resistance value of the magnetoresistance effect element 10 changes. In this case, the first ferromagnetic layer 1 may be referred to as a magnetization fixed layer, and the second ferromagnetic layer 2 may be referred to as a magnetization free layer.

Hereinafter, the first ferromagnetic layer 1 will be described as a magnetization fixed layer, and the second ferromagnetic layer 2 will be described as a magnetization free layer, but this relationship may be reversed. That is, the first ferromagnetic layer 1 may be a magnetization free layer, and the second ferromagnetic layer may be a magnetization fixed layer. In addition, since the magnetoresistance effect element 10 outputs a change in a relative angle between the magnetization of the first ferromagnetic layer 1 and the magnetization of the second ferromagnetic layer 2 as a resistance value change, both the magnetization of the first ferromagnetic layer 1 and the magnetization of the second ferromagnetic layer 2 may change (that is, both the first ferromagnetic layer 1 and the second ferromagnetic layer 2 may be magnetization free layers).

A difference in ease of change between the magnetization of the first ferromagnetic layer 1 and the magnetization of the second ferromagnetic layer 2 when a predetermined external force is applied is caused by the difference between the coercivities of the first ferromagnetic layer 1 and the second ferromagnetic layer 2. For example, when the thickness of the second ferromagnetic layer 2 is thinner than the thickness of the first ferromagnetic layer 1, the coercivity of the second ferromagnetic layer 2 is smaller than the coercivity of the first ferromagnetic layer 1. In addition, an antiferromagnetic layer may be provided on a surface opposite to a surface on which the first insertion layer 4A of the first ferromagnetic layer 1, which is a magnetization fixed layer, is provided. When the antiferromagnetic layer is exchange-coupled with the first ferromagnetic layer 1, unidirectional anisotropy can be imparted in the magnetization direction of the first ferromagnetic layer 1. In this case, the first ferromagnetic layer 1 having a higher coercivity in one direction compared to when no antiferromagnetic layer is provided is obtained. The antiferromagnetic layer is a layer composed of IrMn, PtMn, or the like. In addition, the first ferromagnetic layer 1 may have a synthetic antiferromagnetic structure (SAF structure) including two magnetic layers with a spacer layer therebetween so that a leakage magnetic field does not influence the second ferromagnetic layer 2. The spacer layer may contain at least one selected from the group consisting of Ru, Ir, and Rh.

(Ferromagnetic layer) The first ferromagnetic layer 1 and the second ferromagnetic layer 2 contain a ferromagnetic component. The first ferromagnetic layer 1 and the second ferromagnetic layer 2 of the magnetoresistance effect element 10 shown in FIG. 1 contain one metal selected from the group consisting of Cr, Mn, Co, Fe and Ni, an alloy containing one or more of these metals, and an alloy containing at least one of these metals and at least one element selected from among B, C and N. The first ferromagnetic layer 1 is composed of, for example, Fe, Co—Fe, or Co—Fe—B. The first ferromagnetic layer 1 and the second ferromagnetic layer 2 may be composed of a Heusler alloy. The first ferromagnetic layer 1 and the second ferromagnetic layer 2 preferably contain the same metal elements as the insertion layer, which will be described below in detail. For example, the first ferromagnetic layer 1 and the second ferromagnetic layer 2 preferably contain at least one element selected from Co and Fe.

The Heusler alloy is an intermetallic compound having a chemical composition of XYZ or $X_2YZ$. A ferromagnetic Heusler alloy represented by $X_2YZ$ is called a full Heusler alloy, and a ferromagnetic Heusler alloy represented by XYZ is called a half Heusler alloy. A half Heusler alloy is an alloy in which some atoms for X sites in a full Heusler alloy are vacant. Both are typically intermetallic compounds based on the bcc structure.

Here, in the periodic table, X is a transition metal element selected from the Co, Fe, Ni, and Cu groups or is a noble metal element; Y is a transition metal selected from the Mn, V, Cr and Ti groups or is an element of type X; and Z is a typical element selected from Group III to Group V. Examples of full Heusler alloys include $Co_2FeSi$, $Co_2FeGe$, $Co_2FeGa$, $Co_2FeAl$, $Co_2FeGe_xGa_{1-x}$, $Co_2MnGe_xGa_{1-x}$, $Co_2MnSi$, $Co_2MnGe$, $Co_2MnGa$, $Co_2MnSn$, $Co_2MnAl$, $Co_2CrAl$, $Co_2VAl$, and $Co_2Mn_{1-a}Fe_aAl_bSi_{1-b}$. Examples of half Heusler alloys include NiMnSe, NiMnTe, NiMnSb, PtMnSb, PdMnSb, CoFeSb, NiFeSb, RhMnSb, CoMnSb, IrMnSb, and NiCrSb.

(Nonmagnetic Layer)

The nonmagnetic layer 3 is a nonmagnetic insulator or semiconductor. More specifically, the nonmagnetic layer 3 is composed of an oxide containing Mg and Ga. The nonmagnetic layer 3 may be composed of an oxide containing Mg, Al, and Ga. The nonmagnetic layer 3 is composed of, for example, $MgGa_2O_z$ or $Mg(Al_xGa_{1-x})_2O_Y$. x is a number in the range of $0<x<1$, and Y is a number in the range of $0<Y\leq 4$. The nonmagnetic layer 3 may include a laminate such as $MgO/Ga_2O_3$, $MgO/MgGa_2O_4$, or $MgAl_2O_4/MgGa_2O_4$. In addition to the above, one or more elements selected from among Zn, Cu, Cd, Ag, Pt, and In may be added to the nonmagnetic layer 3. These materials have a large band gap and have excellent insulation. Since these materials contain Ga in the nonmagnetic layer, the band gap is smaller than that of MgO and $MgAl_2O_4$, which is advantageous for reducing RA.

The nonmagnetic layer 3 has, for example, a thickness in the range of 0.5 nm or more and 3 nm or less. The nonmagnetic layer 3 inhibits magnetic coupling between the first ferromagnetic layer 1 and the second ferromagnetic layer 2. The nonmagnetic layer 3 is referred to as a tunnel barrier layer in some cases.

(Insertion Layer)

The first insertion layer 4A and the second insertion layer 4B are ferromagnetic components containing Ga. The first insertion layer 4A prevents Ga contained in the nonmagnetic layer 3 from diffusing into the first ferromagnetic layer 1. The second insertion layer 4B prevents Ga contained in the nonmagnetic layer 3 from diffusing into the second ferromagnetic layer 2. A Ga concentration of the first insertion layer 4A and the second insertion layer 4B is preferably lower than a Ga concentration of the nonmagnetic layer 3. The Ga concentration of the first insertion layer 4A and the second insertion layer 4B decreases away from the nonmagnetic layer 3 in the lamination direction or the direction opposite to the lamination direction. Specifically, in the first insertion layer 4A, the Ga concentration may decrease from the contact surface of the first insertion layer 4A with the nonmagnetic layer 3 toward the contact surface with the first ferromagnetic layer 1. In addition, in the second insertion layer 4B, the Ga concentration may decrease from the contact surface of the second insertion layer 4B with the nonmagnetic layer 3 toward the contact surface with the second ferromagnetic layer 2.

When the Ga concentration of the first insertion layer 4A and the second insertion layer 4B is lower than the Ga concentration of the nonmagnetic layer 3, it is possible to prevent diffusion of the Ga element from the first insertion layer 4A into the first ferromagnetic layer 1 and from the second insertion layer 4B into the second ferromagnetic layer 2.

The Ga concentration of the first insertion layer 4A and the second insertion layer 4B can be measured using, for example, energy dispersive X-ray analysis (EDS). In addition, in the EDS analysis, the Ga concentration in the film thickness direction can also be measured. In addition, in the EDS analysis, composition analysis of other layers constituting the magnetoresistance effect element and composition analysis of other elements can also be performed.

Hereinafter, when the first insertion layer 4A and the second insertion layer 4B are not distinguished, they may simply be referred to as an insertion layer.

The insertion layer may contain the same metal elements as the first ferromagnetic layer 1 and the second ferromagnetic layer 2. When the insertion layer and the first ferromagnetic layer 1 and the second ferromagnetic layer 2 contain the same elements, lattice mismatch is minimized and bias voltage characteristics are improved. For example, the insertion layer contains at least one element selected from Co and Fe. The insertion layer is composed of, for example, Fe—Ga, or Fe—Co—Ga.

The insertion layer is composed of, for example, $Fe_{1-x}Ga_x$. In this case, x is $0<x<0.2$, and preferably $0.01\leq x\leq 0.1$. When x is within the above range, the magnetostriction of the insertion layer is reduced.

In addition, the insertion layer may be composed of a Heusler alloy containing Ga. The Heusler alloy constituting the insertion layer is represented by, for example, $X_2Y_\alpha(Ga_\beta Z1_\gamma)$ or $XY_\alpha(Ga_\beta Z_\gamma)$. α, β, and γ are subscripts that can be selected within a range in which the crystal structure can be maintained. γ may be 0. In addition, when $0.1\leq\beta$ is satisfied, the crystal structure is regularized even at a low temperature, and diffusion of elements into other layers is prevented.

Here, in the periodic table, X is a transition metal element selected from the Co, Fe, Ni, and Cu groups or is a noble metal element; Y is a transition metal selected from the Mn, V, Cr and Ti groups or is an element of type X; and Z1 and Z2 are typical elements selected from Group III to Group V.

The insertion layer is composed of, for example, a Heusler alloy represented by the following General Formula (1).

$$Co_2Fe_\alpha Ga_\beta Ge_\gamma \qquad (1)$$

(in Formula (1), α, β and γ represent numbers that satisfy $2.3\leq\alpha+\beta+\gamma$, $\alpha\leq\beta+\gamma$, and $0.5<\alpha<1.9$, $0.1\leq\beta$, and $0.1\leq\gamma$).

The Heusler alloy of General Formula (1) has improved characteristics as a half metal due to a synergistic effect of Ga and Ge, and an improved spin polarization. Since the insertion layer is in contact with the nonmagnetic layer 3, when the spin polarization of the insertion layer is high, the MR ratio (magnetoresistance ratio) of the magnetoresistance effect element 10 increases.

The thickness of the first insertion layer 4A and the second insertion layer 4B is preferably 2 nm or less. The change in the magnetoresistance of the magnetoresistance effect element 10 occurs due to a difference in the relative angle of two ferromagnetic magnetizations in contact with the nonmagnetic layer 3. When the thickness of the first insertion layer 4A and the second insertion layer 4B is thick, the influence of the first insertion layer 4A and the second insertion layer 4B on the change in the magnetoresistance becomes large. In addition, when the thickness of the first insertion layer 4A and the second insertion layer 4B is thin, the magnetostriction can be reduced.

The lower limit value of the thickness of the first insertion layer 4A and the second insertion layer 4B is preferably 0.05 nm.

The thickness of the first insertion layer 4A and the second insertion layer 4B is an average value of the values measured at 5 points using high-resolution transmission electron microscopy (HRTEM). Hereinafter, the thickness of each layer of the magnetoresistance effect element is measured by the same method.

The compositions and thicknesses of the first insertion layer 4A and the second insertion layer 4B may be the same as or different from each other.

[Method of Producing Magnetoresistance Effect Element]

Next, a method of producing the magnetoresistance effect element 10 will be described. In the method of producing the magnetoresistance effect element 10 according to the first embodiment, first, a substrate serving as a base for film formation is prepared. The substrate may be crystalline or amorphous. The crystalline substrate is, for example, a substrate composed of one or more selected from among metal oxide single crystals, silicon single crystals, sapphire single crystals, and ceramics. The amorphous substrate is, for example, a substrate composed of one or more selected from among silicon single crystals with a thermal oxide film, glass, and quartz.

Next, the first ferromagnetic layer 1, the first insertion layer 4A, the nonmagnetic layer 3, the second insertion layer 4B, and the second ferromagnetic layer 2 are film-formed on a substrate in that order. These layers are film-formed by, for example, a sputtering method. In addition, these layers are formed into a predetermined shape by photolithography and annealed.

Here, an underlayer may be formed on a surface of the substrate on the side of the magnetoresistance effect element. The underlayer has, for example, a nitride layer having a (001) oriented NaCl structure and containing at least one element selected from the group consisting of Ti, Zr, Nb, V, Hf, Ta, Mo, W, B, Al, and Ce, a layer of a (002) oriented perovskite conductive oxide represented by a composition formula of $ABO_3$, an oxide layer having a (001) oriented NaCl structure and containing at least one element selected from the group consisting of Mg, Al, and Ce, or a layer having a (001) oriented tetragonal structure or cubic structure and containing at least one element selected from the group consisting of Al, Cr, Fe, Co, Rh, Pd, Ag, Ir, Pt, Au, Mo, and W.

The magnetoresistance effect element 10 according to the present embodiment has a small RA. This is thought to be caused by the fact that the first insertion layer 4A and the second insertion layer 4B containing Ga prevent diffusion of Ga from the nonmagnetic layer 3.

In addition, when the nonmagnetic layer 3 is composed of an oxide containing Mg, Al, and Ga, $MgAl_2O_4$ in which an oxide constituting the nonmagnetic layer 3 is stable may be selected, and excess Ga may be discharged to other layers. In this case, the first insertion layer 4A and the second insertion layer 4B containing Ga can prevent diffusion of Ga from the nonmagnetic layer 3, and the RA of the magnetoresistance effect element 10 can be reduced.

Modification Example 1

Figure 2:
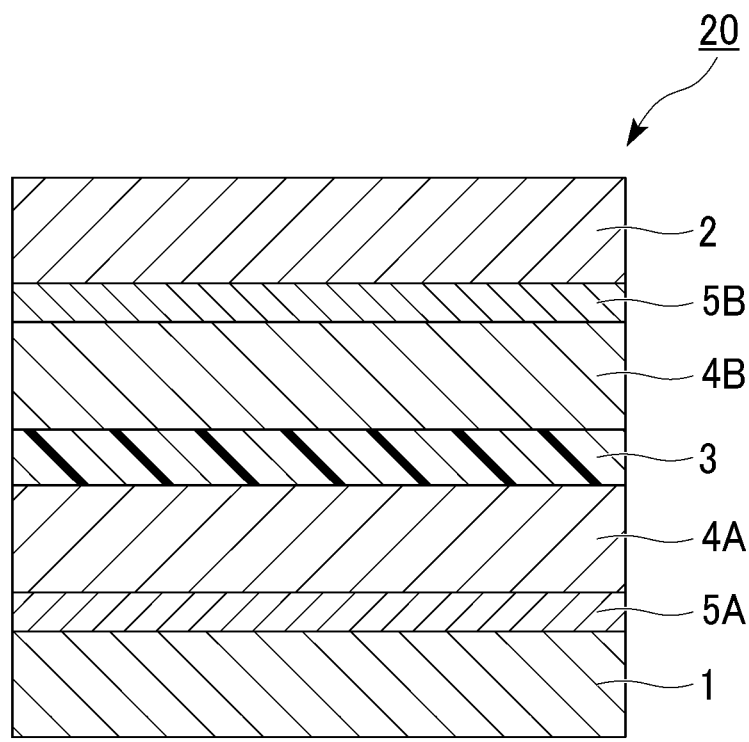
FIG. 2 is a cross-sectional view of a magnetoresistance effect element according to Modification Example 1.

FIG. 2 is a schematic cross-sectional view of a magnetoresistance effect element 20 according to Modification Example 1. The magnetoresistance effect element 20 is different from the magnetoresistance effect element 10 in that it has a first metal particle layer 5A and a second metal particle layer 5B. The same configurations as those of the magnetoresistance effect element 10 will be denoted with the same reference numerals, and descriptions thereof will be omitted.

The first metal particle layer 5A is disposed between the first ferromagnetic layer 1 and the first insertion layer 4A. The second metal particle layer 5B is disposed between the second ferromagnetic layer 2 and the second insertion layer 4B. The thickness of the first metal particle layer 5A and the second metal particle layer 5B is, for example, 1 nm or less. The thickness of the first metal particle layer 5A and the second metal particle layer 5B is an average thickness in the in-plane direction. When the average thickness is 1 nm or less, the thicknesses of the first metal particle layer 5A and the second metal particle layer 5B are unlikely to be homogeneous in the layers. The first metal particle layer 5A and the second metal particle layer 5B may be a layer in which metal particles are scattered or a layer having an opening at a part of the metal layer.

The lower limit value of the thickness of the first metal particle layer 5A and the second metal particle layer 5B is preferably 0.01 nm.

The first metal particle layer 5A and the second metal particle layer 5B contain any one element selected from the group consisting of Ta, W, and Mo.

Even if the magnetoresistance effect element 20 according to Modification Example 1 is used, the same effects can be obtained as when the magnetoresistance effect element 10 according to the first embodiment is used. In addition, elements selected from the group consisting of Ta, W, and Mo contained in the first metal particle layer 5A and the second metal particle layer 5B are all heavy metals. Therefore, heavy metal elements of the first metal particle layer 5A and the second metal particle layer 5B serve as a barrier for Ga contained in the nonmagnetic layer 3 and the insertion layer. That is, the magnetoresistance effect element 20 can prevent Ga from diffusing into the nonmagnetic layer 3 and the insertion layer.

In addition, since the thickness of the first metal particle layer 5A and the second metal particle layer 5B is sufficiently thin, the magnetic coupling between the first ferromagnetic layer 1 and the first insertion layer 4A and between the second ferromagnetic layer 2 and the second insertion layer 4B is maintained.

Modification Example 2

Figure 3:
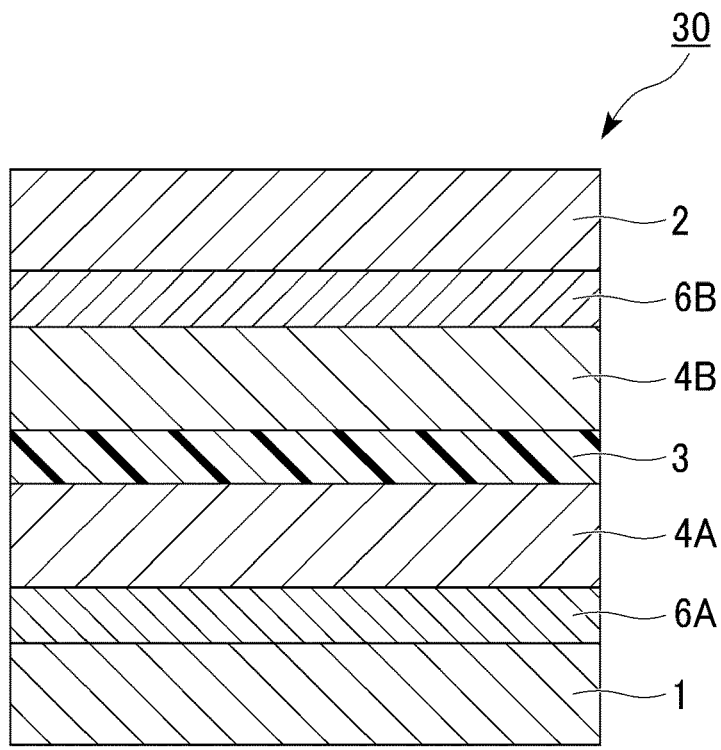
FIG. 3 is a cross-sectional view of a magnetoresistance effect element according to Modification Example 2.

FIG. 3 is a schematic cross-sectional view of a magnetoresistance effect element 30 according to Modification Example 2. The magnetoresistance effect element 30 is different from the magnetoresistance effect element 10 in that it has a first magnetostriction-reducing layer 6A and a second magnetostriction-reducing layer 6B. The same configurations as those of the magnetoresistance effect element 10 will be denoted with the same reference numerals, and descriptions thereof will be omitted.

Hereinafter, when the first magnetostriction-reducing layer 6A and the second magnetostriction-reducing layer 6B are not distinguished, they may simply be referred to as a magnetostriction-reducing layer.

The first magnetostriction-reducing layer 6A and the second magnetostriction-reducing layer 6B are disposed at arbitrary positions in the lamination direction of the magnetoresistance effect element 30. For example, the first magnetostriction-reducing layer 6A is disposed between the first ferromagnetic layer 1 and the first insertion layer 4A. For example, the second magnetostriction-reducing layer 6B is disposed between the second ferromagnetic layer 2 and the second insertion layer 4B.

In the first magnetostriction-reducing layer 6A and the second magnetostriction-reducing layer 6B, a material that causes magnetostriction in a direction opposite to that of the insertion layer is used. When the insertion layer is composed of Fe—Ga, it has positive magnetostriction. In this case, the first magnetostriction-reducing layer 6A and the second magnetostriction-reducing layer 6B may have negative magnetostriction. The first magnetostriction-reducing layer 6A and the second magnetostriction-reducing layer 6B having negative magnetostriction may be composed of Ni—Fe alloy, Ni, SmFe, $ErFe_2$, $TmFe_2$, CoSiB, or the like.

Even if the magnetoresistance effect element 30 according to Modification Example 2 is used, the same effects can be obtained as when the magnetoresistance effect element 10 according to the first embodiment is used. In addition, in the first magnetostriction-reducing layer 6A and the second magnetostriction-reducing layer 6B, magnetostriction may occur in a direction facing the magnetostriction of the first insertion layer 4A and the second insertion layer 4B. Therefore, in the magnetoresistance effect element 30, a force is applied so that the first insertion layer 4A and the second insertion layer 4B, and the first magnetostriction-reducing layer 6A and the second magnetostriction-reducing layer 6B each become flat, and the magnetostriction is minimized. Since the magnetostriction causes noise in the magnetic sensor, a magnetic sensor having high sensitivity can be obtained according to the magnetoresistance effect element 30 of the present embodiment.

Modification Example 3

Figure 4:
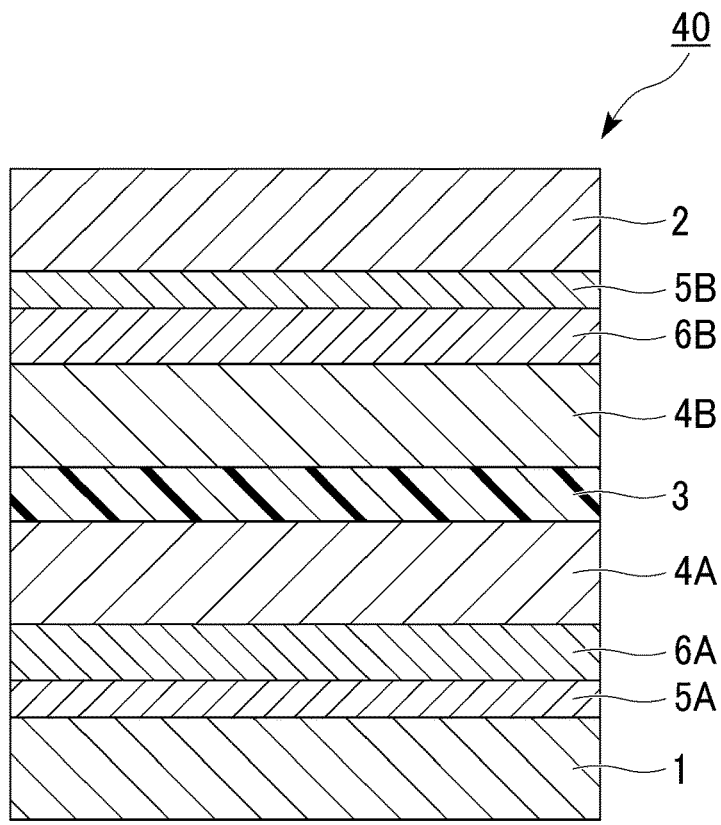
FIG. 4 is a cross-sectional view of a magnetoresistance effect element according to Modification Example 3.

FIG. 4 is a schematic cross-sectional view of a magnetoresistance effect element 40 according to Modification Example 3. The magnetoresistance effect element 40 is different from the magnetoresistance effect element 20 in that it has the first magnetostriction-reducing layer 6A and the second magnetostriction-reducing layer 6B. The same configurations as those of the magnetoresistance effect element 20 will be denoted with the same reference numerals, and descriptions thereof will be omitted.

For example, the first magnetostriction-reducing layer 6A is disposed between the first metal particle layer 5A and the first insertion layer 4A. For example, the second magnetostriction-reducing layer 6B is disposed between the second metal particle layer 5B and the second insertion layer 4B.

Even if the magnetoresistance effect element 40 according to Modification Example 3 is used, the same effects can be obtained as when the magnetoresistance effect element 20 according to Modification Example 1 is used. In addition, since the magnetoresistance effect element 40 includes the first magnetostriction-reducing layer 6A and the second magnetostriction-reducing layer 6B, it is possible to minimize the magnetostriction of the first insertion layer 4A and the second insertion layer 4B. Since the magnetostriction causes noise in the magnetic sensor, a magnetic sensor having high sensitivity can be obtained according to the magnetoresistance effect element 40 of the present embodiment.

Here, FIG. 4 shows an example in which the first magnetostriction-reducing layer 6A is disposed between the first metal particle layer 5A and the first insertion layer 4A, and the second magnetostriction-reducing layer 6B is disposed between the second metal particle layer 5B and the second insertion layer 4B. However, Modification Example 3 is not limited to this example. The first magnetostriction-reducing layer 6A may be disposed between the first ferromagnetic layer 1 and the first metal particle layer 5A, and the second magnetostriction-reducing layer 6B may be disposed between the second ferromagnetic layer 2 and the second metal particle layer 5B.

While preferable embodiments of the present disclosure have been described above in detail with reference to the drawings, configurations in the embodiments, combinations thereof, and the like are examples, and additions, omissions, substitutions, and other modifications of configurations can be made without departing from the spirit and scope of the present disclosure.

In the above, an example in which the magnetoresistance effect element 10 has both the first insertion layer 4A and the second insertion layer 4B has been shown, but only one of them may be used. In addition, only one of the first metal particle layer 5A and the second metal particle layer 5B may be used, and only one of the first magnetostriction-reducing layer 6A and the second magnetostriction-reducing layer 6B may be used.

The magnetoresistance effect elements 10, 20, 30, and 40 can be used for various applications. The magnetoresistance effect elements 10, 20, 30, and 40 can be applied to, for example, a magnetic head, a magnetic sensor, a magnetic memory, a high-frequency filter, or the like.

Next, application examples of the magnetoresistance effect element according to the present embodiment will be described. Here, in the following application examples, the magnetoresistance effect element 10 is used as a magnetoresistance effect element, but the magnetoresistance effect element is not limited thereto, and the magnetoresistance effect element 20, 30, or 40 can also be applied.

Figure 5:
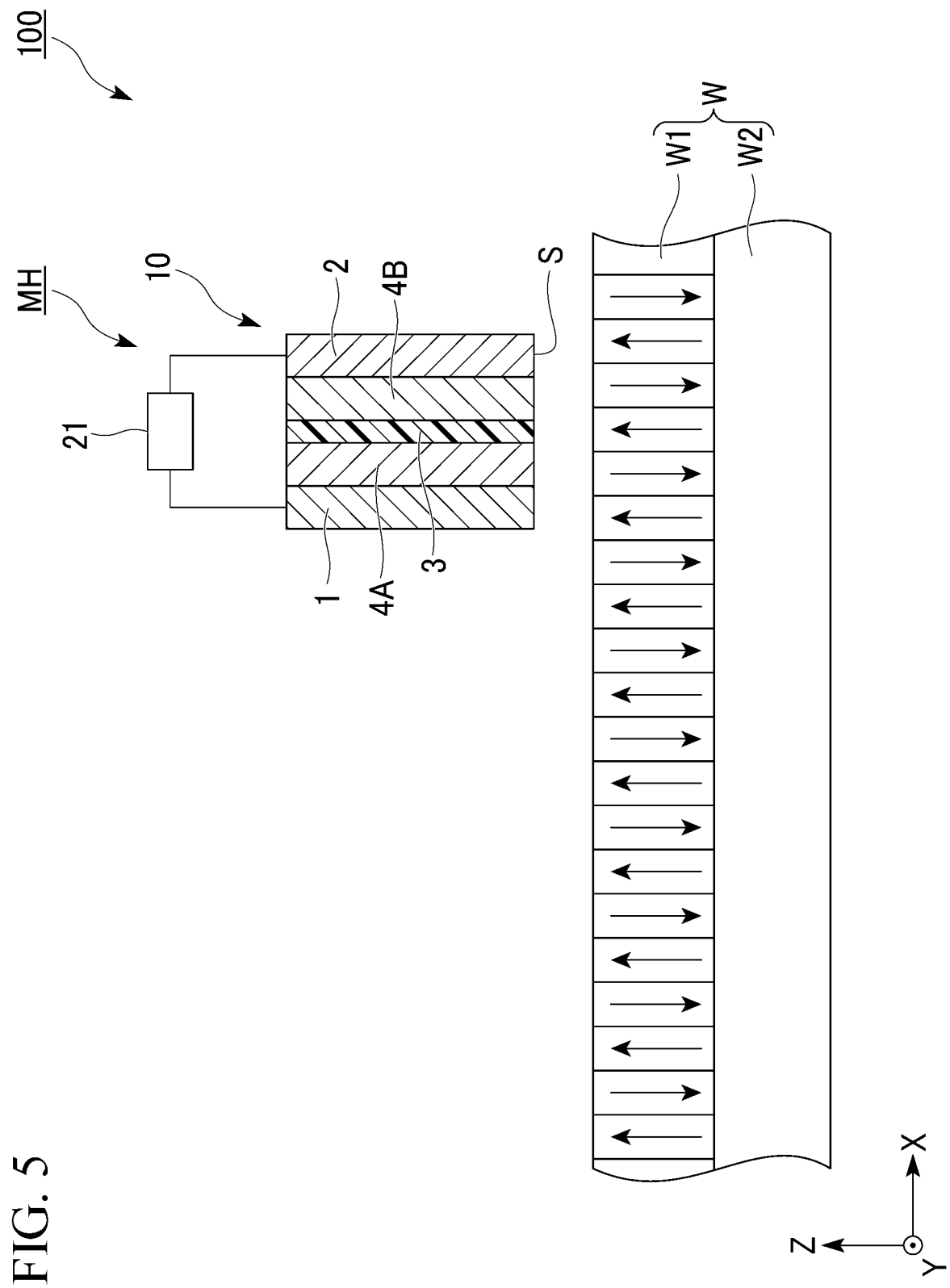
FIG. 5 is a cross-sectional view of a magnetic recording element according to Application Example 1.

FIG. 5 is a cross-sectional view of a magnetic recording element according to Application Example 1. FIG. 5 is a cross-sectional view of the magnetoresistance effect element cut in the lamination direction.

As shown in FIG. 5, a magnetic recording element 100 includes a magnetic head MH and a magnetic recording medium W. In FIG. 5, one direction in which the magnetic recording medium W extends is defined as an X direction, and the direction perpendicular to the X direction is defined as a Y direction. The XY plane is parallel to the main surface of the magnetic recording medium W. A direction in which the magnetic recording medium W is connected to the magnetic head MH and which is perpendicular to the XY plane is defined as a Z direction.

In the magnetic head MH, an air-bearing surface (medium facing surface) S faces the surface of the magnetic recording medium W. The magnetic head MH moves in the directions of the arrow +X and arrow −X along the surface of the magnetic recording medium W at a position a predetermined distance away from the magnetic recording medium W. Here, the direction parallel to the same direction as the direction of the X direction arrow in FIG. 5 is defined as a +X direction, and the direction antiparallel to the direction of the X direction arrow is defined as a −X direction. The same applies to other application examples below. The magnetic head MH includes the magnetoresistance effect element 10 that functions as a magnetic sensor and a magnetic recording unit (not shown). A resistance measuring device 21 measures the lamination direction and the resistance value of the magnetoresistance effect element 10.

The magnetic recording unit applies a magnetic field to a recording layer W1 of the magnetic recording medium W, and determines the magnetization direction of the recording layer W1. That is, the magnetic recording unit performs magnetic recording of the magnetic recording medium W.

The magnetoresistance effect element 10 reads information about the magnetization of the recording layer W1 written by the magnetic recording unit.

The magnetic recording medium W has the recording layer W1 and a baking layer W2. The recording layer W1 is a part in which magnetic recording is performed, and the baking layer W2 is a magnetic path (magnetic flux path) through which a magnetic flux for writing is returned again to the magnetic head MH. In the recording layer W1, the magnetic information is recorded as the magnetization direction.

The second ferromagnetic layer 2 of the magnetoresistance effect element 10 is a magnetization free layer. Therefore, the second ferromagnetic layer 2 exposed on the air-bearing surface S is influenced by the magnetization recorded in the facing recording layer W1 of the magnetic recording medium W. In FIG. 5, the magnetization direction of the second ferromagnetic layer 2 is oriented in the +Z direction under the influence of the magnetization oriented in the +Z direction of the recording layer W1. In this case, the magnetization directions of the first ferromagnetic layer 1 and the second ferromagnetic layer 2, which are magnetization fixed layers, are parallel to each other. Here, the direction parallel to the same direction as the direction of the Z direction arrow in FIG. 5 is defined as a +Z direction, and the direction antiparallel to the direction of the Z direction arrow is defined as a −Z direction. The same applies to other application examples below.

Here, the resistance when the magnetization directions of the first ferromagnetic layer 1 and the second ferromagnetic layer 2 are parallel to the same direction is different from the resistance when the magnetization directions of the first ferromagnetic layer 1 and the second ferromagnetic layer 2 are antiparallel. When the difference between the resistance value when the magnetization directions are parallel to the same direction and the resistance value when the magnetization directions are antiparallel is larger, the MR ratio of the magnetoresistance effect element 10 is larger. The magnetoresistance effect element 10 according to the present embodiment includes the nonmagnetic layer 3 containing Ga, the first insertion layer 4A and the second insertion layer 4B and has a small RA. Therefore, the information on the magnetization of the recording layer W1 can be read as a resistance value change with a low output by the resistance measuring device 21.

The shape of the magnetoresistance effect element 10 of the magnetic head MH is not particularly limited. For example, in order to avoid the influence of a leakage magnetic field of the magnetic recording medium W with respect to the first ferromagnetic layer 1 of the magnetoresistance effect element 10, the first ferromagnetic layer 1 may be provided at a position away from the magnetic recording medium W.

Figure 6:
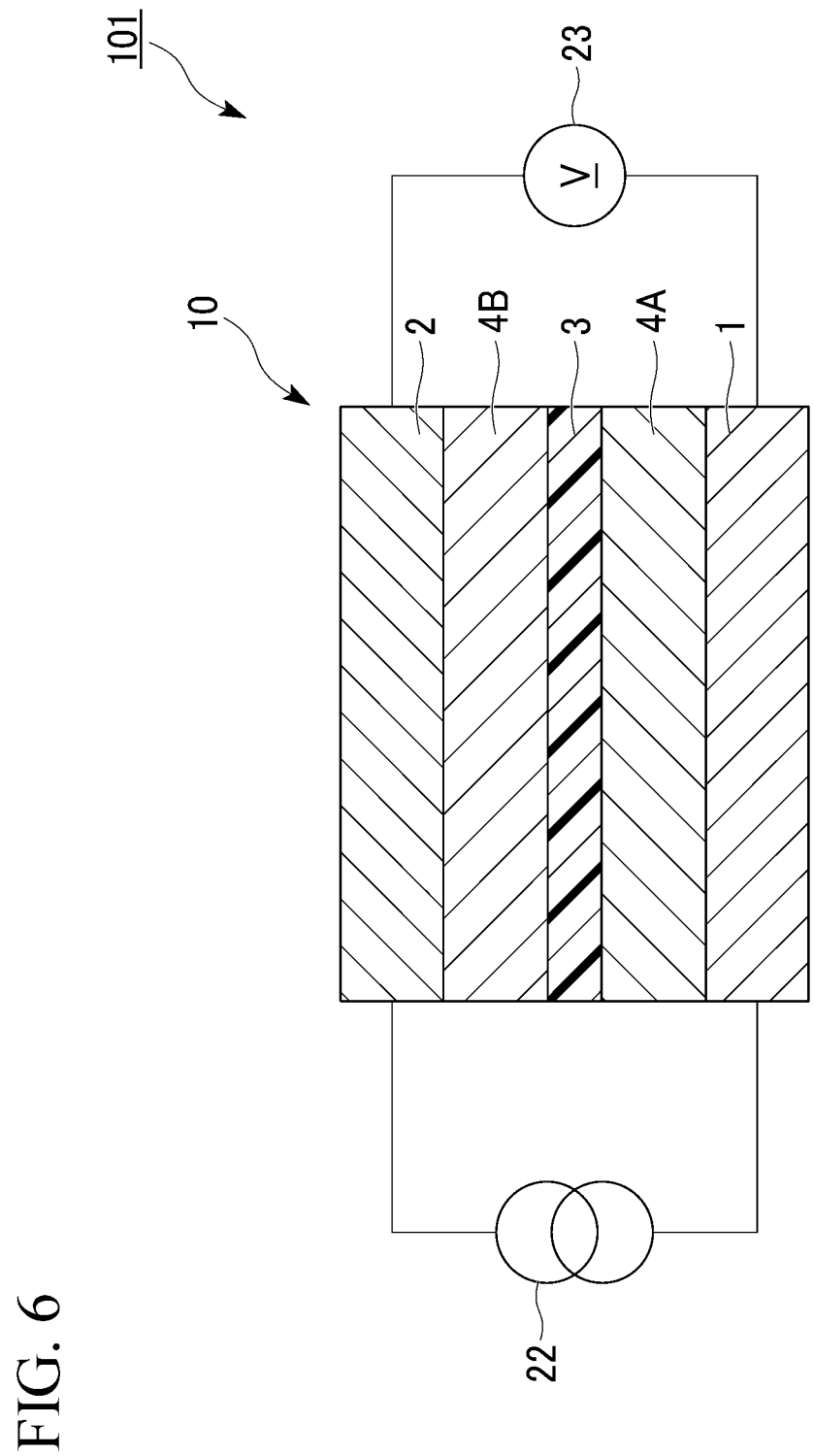
FIG. 6 is a cross-sectional view of a magnetic recording element according to Application Example 2.

FIG. 6 is a cross-sectional view of a magnetic recording element 101 according to Application Example 2. FIG. 6 is a cross-sectional view of the magnetic recording element 101 cut in the lamination direction.

As shown in FIG. 6, the magnetic recording element 101 includes the magnetoresistance effect element 10, a power supply 22, and a measurement unit 23. The power supply 22 provides a potential difference in the lamination direction of the magnetoresistance effect element 10. The power supply 22 is a DC power supply in this application example. The measurement unit 23 measures the resistance value of the magnetoresistance effect element 10 in the lamination direction.

When a potential difference is generated between the first ferromagnetic layer 1 and the second ferromagnetic layer 2 by the power supply 22, a current flows in the lamination direction of the magnetoresistance effect element 10. When the current is spin-polarized when passing through the first ferromagnetic layer 1, it becomes a spin-polarized current. The spin-polarized current reaches the second ferromagnetic layer 2 with the nonmagnetic layer 3 therebetween. The magnetization of the second ferromagnetic layer 2 receives a spin-transfer torque (STT) due to the spin-polarized current and the magnetization is revered. When a relative angle between the magnetization direction of the first ferromagnetic layer 1 and the magnetization direction of the second ferromagnetic layer 2 is changed, the resistance value of the magnetoresistance effect element 10 in the lamination direction changes. The resistance value of the magnetoresistance effect element 10 in the lamination direction is read by the measurement unit 23. That is, the magnetic recording element 101 shown in FIG. 6 is a spin-transfer torque (STT) type magnetic recording element.

In the magnetic recording element 101 shown in FIG. 6, since the nonmagnetic layer 3, the first insertion layer 4A and the second insertion layer 4B contain Ga, the RA is small and data can be read with a low output.

Figure 7:
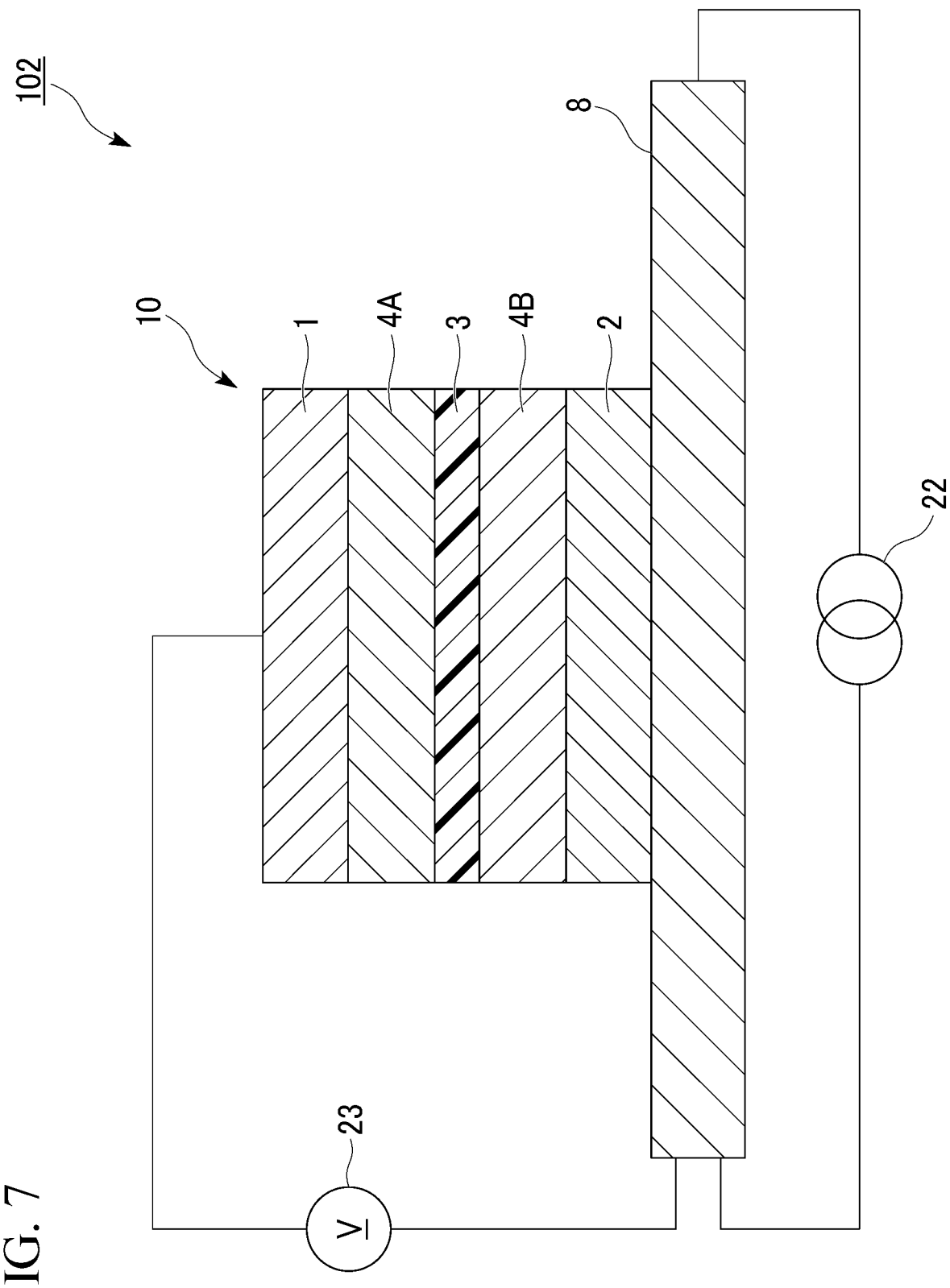
FIG. 7 is a cross-sectional view of a magnetic recording component according to Application Example 3.

FIG. 7 is a cross-sectional view of a magnetic recording element 102 according to Application Example 3. FIG. 7 is a cross-sectional view of the magnetic recording element 102 cut in the lamination direction.

As shown in FIG. 7, the magnetic recording element 102 includes the magnetoresistance effect element 10, a spin-orbit torque wiring 8, the power supply 22, and the measurement unit 23. The spin-orbit torque wiring 8 is in contact with the second ferromagnetic layer 2 in this application example. The spin-orbit torque wiring 8 extends in one direction in the in-plane direction. The power supply 22 is connected to a first end and a second end of the spin-orbit torque wiring 8. The magnetoresistance effect element 10 is inserted between the first end and the second end in plan view. The power supply 22 causes a write current to flow along the spin-orbit torque wiring 8. The measurement unit 23 measures the resistance value of the magnetoresistance effect element 10 in the lamination direction.

When a potential difference is generated between the first end and the second end of the spin-orbit torque wiring 8 by the power supply 22, a current flows in the in-plane direction of the spin-orbit torque wiring 8. The spin-orbit torque wiring 8 has a function of generating a spin current due to a spin Hall effect when a current flows. For example, the spin-orbit torque wiring 8 contains any of a metal, an alloy, an intermetallic compound, a metal boride, a metal carbide, a metal silicide, and a metal phosphide, which have a function of generating a spin current due to a spin Hall effect when a current flows. For example, the wiring contains a nonmagnetic metal including d electrons or f electrons in the outermost shell and having an atomic number of 39 or more.

When a current flows in the in-plane direction of the spin-orbit torque wiring 8, a spin Hall effect is exhibited due to the spin-orbit interaction. The spin Hall effect is a phenomenon in which moving spins are bent in the direction perpendicular to the direction in which a current flows. According to the spin Hall effect, an uneven distribution of spins in the spin-orbit torque wiring 8 is produced and a spin current is induced in the thickness direction of the spin-orbit torque wiring 8. Spins are injected from the spin-orbit torque wiring 8 to the second ferromagnetic layer 2 by the spin current.

Spins injected into the second ferromagnetic layer 2 provide a spin-orbit torque (SOT) to the magnetization of the second ferromagnetic layer 2. The second ferromagnetic layer 2 receives the spin-orbit torque (SOT) and reverses the magnetization. When the relative angle between the magnetization direction of the first ferromagnetic layer 1 and the magnetization direction of the second ferromagnetic layer 2 changes, the resistance value of the magnetoresistance effect element 10 in the lamination direction changes. The resistance value of the magnetoresistance effect element 10 in the lamination direction is read by the measurement unit 23. That is, the magnetic recording element 102 shown in FIG. 7 is a spin-orbit torque (SOT) type magnetic recording element.

In the magnetic recording element 102 shown in FIG. 7, since the nonmagnetic layer 3, the first insertion layer 4A and the second insertion layer 4B contain Ga and the RA is small, data can be read with a low output.

Figure 8:
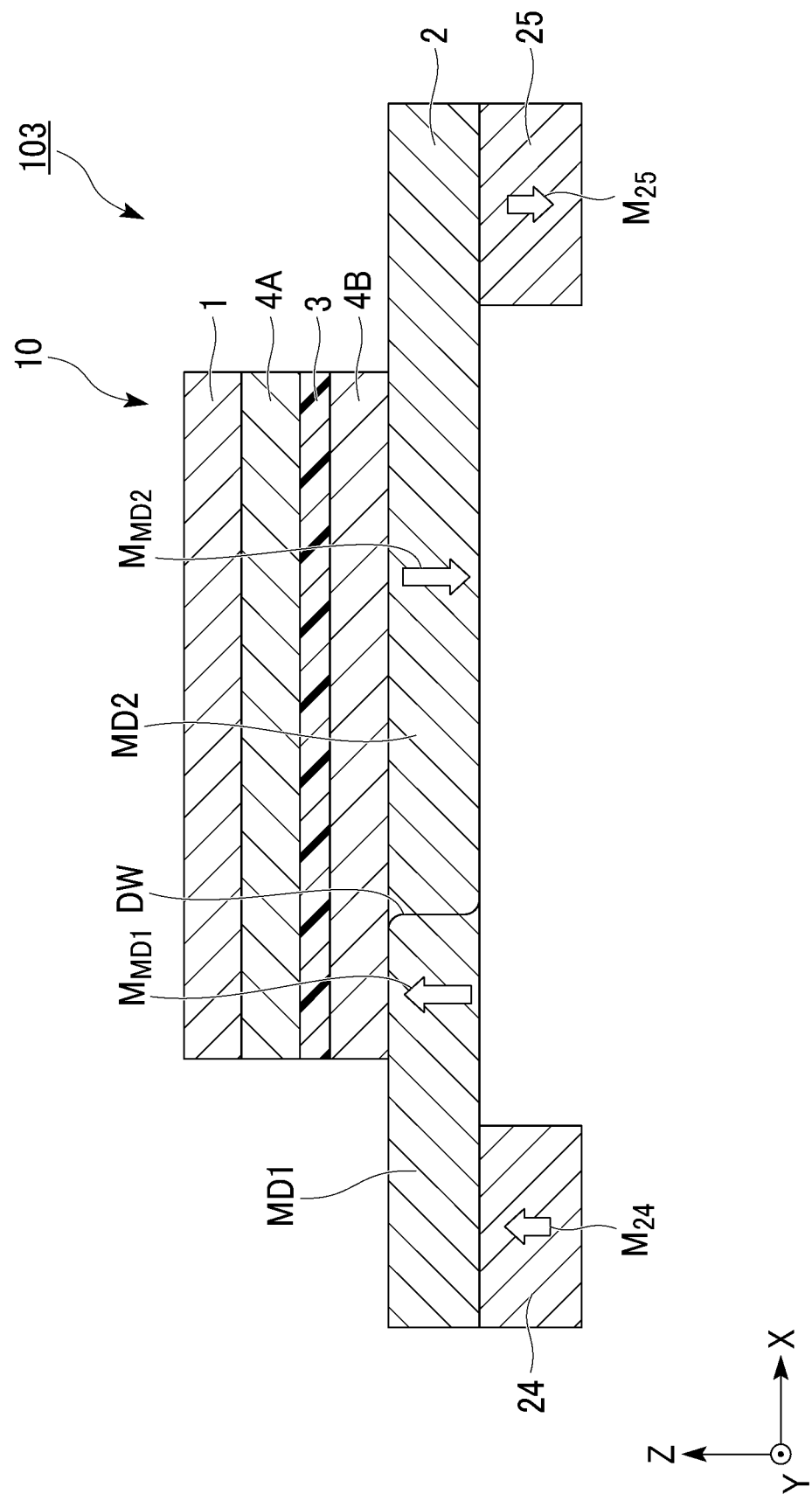
FIG. 8 is a cross-sectional view of a magnetic domain wall movement element according to Application Example 4.

FIG. 8 is a cross-sectional view of a magnetic domain wall movement element (magnetic domain wall displacement type magnetic recording element) according to Application Example 4. A magnetic domain wall movement element 103 includes the magnetoresistance effect element 10, a first magnetization fixed layer 24, and a second magnetization fixed layer 25. The magnetoresistance effect element 10 includes the first ferromagnetic layer 1, the second ferromagnetic layer 2, the nonmagnetic layer 3, the first insertion layer 4A, and the second insertion layer 4B. In FIG. 8, the direction in which the second ferromagnetic layer 2 extends is defined as an X direction, the direction perpendicular to the X direction is defined as a Y direction, and the direction perpendicular to the XY plane is defined as a Z direction.

The first magnetization fixed layer 24 and the second magnetization fixed layer 25 are connected to a first end and a second end of the second ferromagnetic layer 2. The first ferromagnetic layer 1 and the nonmagnetic layer 3 are inserted between the first end and the second end of the second ferromagnetic layer 2 in the X direction. In other words, the second ferromagnetic layer 2 extends so that a width of the second ferromagnetic layer 2 from the first end to the second end in the X direction is larger than a width of the first ferromagnetic layer 1 and the nonmagnetic layer 3 in the X direction, and the first ferromagnetic layer 1 and the nonmagnetic layer 3 are laminated at the center of the second ferromagnetic layer 2.

The second ferromagnetic layer 2 is a layer in which information can be magnetically recorded according to the change in the internal magnetic state. The second ferromagnetic layer 2 includes a first magnetic domain MD1 and a second magnetic domain MD2 therein. The magnetization of the second ferromagnetic layer 2 at a position overlapping the first magnetization fixed layer 24 or the second magnetization fixed layer 25 in the Z direction is fixed in one direction. The magnetization at a position overlapping the first magnetization fixed layer 24 in the Z direction is, for example, fixed in the +Z direction, and the magnetization at a position overlapping the second magnetization fixed layer 25 in the Z direction is, for example, fixed in the −Z direction. As a result, a domain wall DW is formed at the boundary between the first magnetic domain MD1 and the second magnetic domain MD2. The second ferromagnetic layer 2 can have the domain wall DW therein. In the second ferromagnetic layer 2 shown in FIG. 8, the magnetization $M_{MD1}$ of the first magnetic domain MD1 is oriented in the +Z direction, and the magnetization $M_{MD2}$ of the second magnetic domain MD2 is oriented in the −Z direction.

The magnetic domain wall movement element 103 can record data in multiple values or continuously depending on the position of the domain wall DW of the second ferromagnetic layer 2. The data recorded in the second ferromagnetic layer 2 is read as a resistance value change of the magnetic domain wall movement element 103 when a read current is applied.

The ratio between the first magnetic domain MD1 and the second magnetic domain MD2 in the second ferromagnetic layer 2 changes when the domain wall DW moves. For example, the magnetization $M_1$ of the first ferromagnetic layer 1 has the same direction (parallel) as the magnetization $M_{MD1}$ of the first magnetic domain MD1 and has a direction (antiparallel) opposite to that of the magnetization $M_{MD2}$ of the second magnetic domain MD2. When the domain wall DW moves in the +X direction, and an area of the first magnetic domain MD1 in the part overlapping the first ferromagnetic layer 1 in plan view in the Z direction increases, the resistance value of the magnetic domain wall movement element 103 decreases. On the other hand, when the domain wall DW moves in the −X direction and an area of the second magnetic domain MD2 in the part overlapping the first ferromagnetic layer 1 in plan view in the Z direction increases, the resistance value of the magnetic domain wall movement element 103 increases.

The domain wall DW moves when a write current flows in the X direction of the second ferromagnetic layer 2 or an external magnetic field is applied. For example, when a write current (for example, a current pulse) is applied in the +X direction of the second ferromagnetic layer 2, since electrons flow in the −X direction opposite to the direction of the current, the domain wall DW moves in the −X direction. When a current flows from the first magnetic domain MD1 toward the second magnetic domain MD2, electrons spin-polarized in the second magnetic domain MD2 reverse the magnetization $M_{MD1}$ of the first magnetic domain MD1. When the magnetization $M_{MD1}$ of the first magnetic domain MD1 is reversed, the domain wall DW moves in the −X direction.

In the magnetic domain wall movement element 103 shown in FIG. 8, since the nonmagnetic layer 3, the first insertion layer 4A and the second insertion layer 4B contain Ga, the stability of data is improved.

Figure 9:
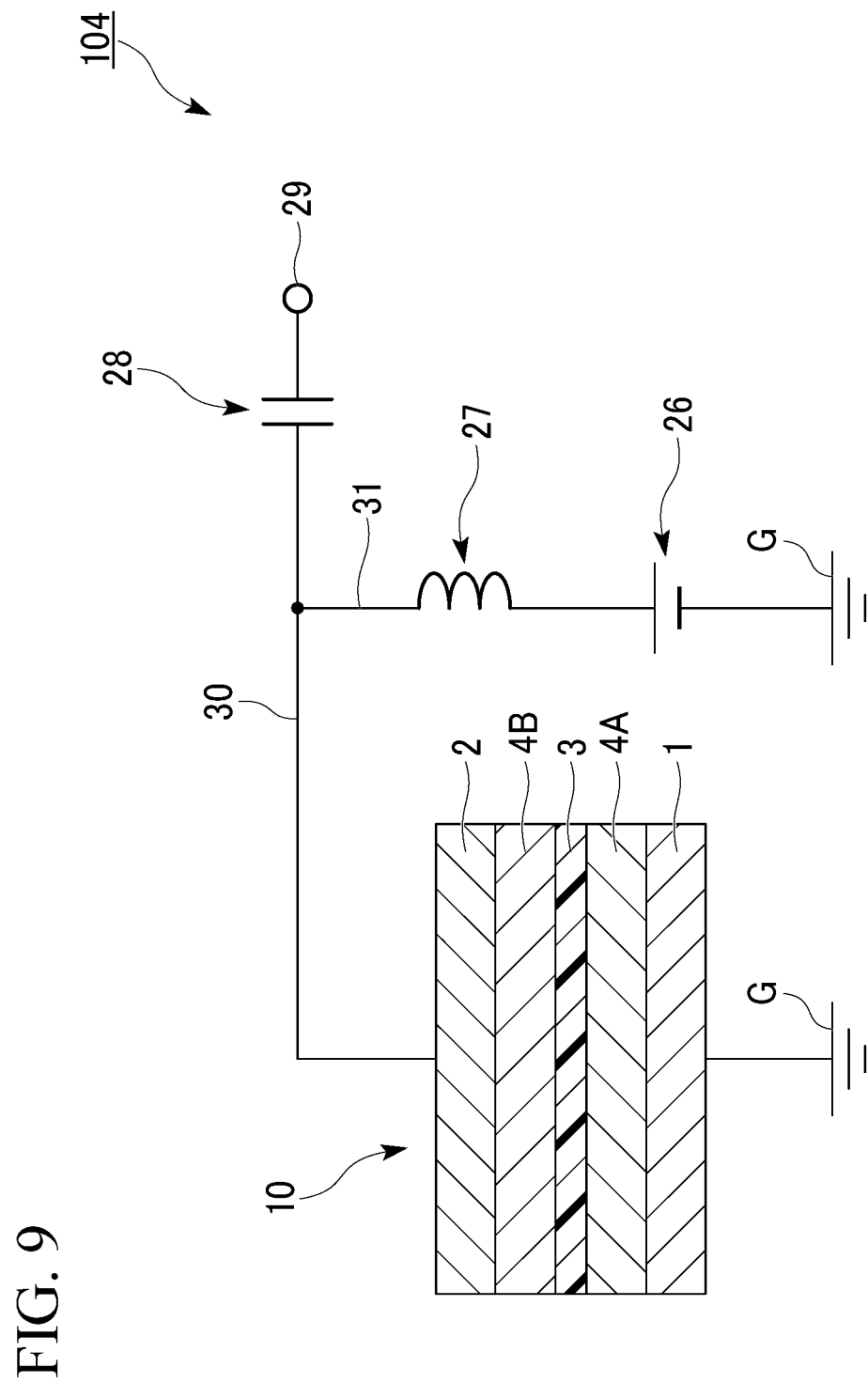
FIG. 9 is a cross-sectional view of a high-frequency device according to Application Example 5.

FIG. 9 is a schematic view of a high-frequency device 104 according to Application Example 5. As shown in FIG. 9, the high-frequency device 104 includes the magnetoresistance effect element 10, a DC power supply 26, an inductor 27, a capacitor 28, an output port 29, and the wirings 30 and 31.

The wiring 30 connects the magnetoresistance effect element 10 to the output port 29. The wiring 31 branches from the wiring 30 and reaches a ground G via the inductor 27 and the DC power supply 26. For the DC power supply 26, the inductor 27, and the capacitor 28, known components can be used. The inductor 27 cuts a high-frequency component of the current and allows an invariant component of the current to pass through. The capacitor 28 passes a high-frequency component of the current and cuts an invariant component of the current. The inductor 27 is arranged in a part in which a flow of a high-frequency current is desired to be restricted and the capacitor 28 is arranged in a part in which a flow of a DC current is desired to be restricted.

When an alternating current or an alternating magnetic field is applied to the ferromagnetic layer included in the magnetoresistance effect element 10, the magnetization of the second ferromagnetic layer 2 precesses. The magnetization of the second ferromagnetic layer 2 vibrates strongly when the frequency of the high-frequency current or the high-frequency magnetic field applied to the second ferromagnetic layer 2 approaches the ferromagnetic resonance frequency of the second ferromagnetic layer 2, and does not vibrate much at a frequency away from the ferromagnetic resonance frequency of the second ferromagnetic layer 2. This phenomenon is called a ferromagnetic resonance phenomenon.

The resistance value of the magnetoresistance effect element 10 changes due to vibration of the magnetization of the second ferromagnetic layer 2. The DC power supply 26 applies a DC current to the magnetoresistance effect element 10. The DC current flows in the lamination direction of the magnetoresistance effect element 10. The DC current flows to the ground G through the wirings 30 and 31, and the magnetoresistance effect element 10. The potential of the magnetoresistance effect element 10 differs according to Ohm's law. A high-frequency signal is output from the output port 29 according to the change in the potential of the magnetoresistance effect element 10 (change in the resistance value).

In the high-frequency device 104 shown in FIG. 9, since the nonmagnetic layer 3, the first insertion layer 4A and the second insertion layer 4B contain Ga, the RA is small and a high-frequency signal can be easily output.

EXAMPLES

Example 1

On the (001) plane of a MgO substrate, first, a Cr layer with a thickness of 40 nm was formed as an underlayer and annealed at 800° C. The underlayer served as a wiring connected to a magnetoresistance effect element. Next, a first ferromagnetic layer and a first insertion layer were laminated on the underlayer in this order, and annealed at 300° C. The first ferromagnetic layer was a Fe layer with a thickness of 30 nm and the first insertion layer was a $Fe_{0.9}Ga_{0.1}$ layer with a thickness of 1.5 nm.

Next, on the first insertion layer, a Mg layer with a thickness of 0.3 nm and a $MgGa_2O_x$ layer with a thickness of 0.7 nm were formed, and annealed at 500° C. When oxygen was diffused by annealing, the Mg layer and the $MgGa_2O_x$ layer were combined into a nonmagnetic layer.

Next, on the nonmagnetic layer, a second insertion layer and a second ferromagnetic layer were formed. The second insertion layer was a $Fe_{0.9}Ga_{0.1}$ layer with a thickness of 1.5 nm and the second ferromagnetic layer with a Fe layer with a thickness of 6 nm. Then, on the second ferromagnetic layer, an IrMn layer with a thickness of 12 nm was laminated as an antiferromagnetic layer. Finally, a Ru layer with a thickness of 10 nm was laminated as a cap layer, and annealed at 300° C. in a magnetic field of 15 kOe for 3 hours.

A magnetoresistance effect element of Example 1 had a substrate, an underlayer, a first ferromagnetic layer, a first insertion layer, a nonmagnetic layer, a second insertion layer, a second ferromagnetic layer, an antiferromagnetic layer, and a cap layer. The configurations of respective layers during film formation were, in the above order, MgO(001), Cr (40 nm), Fe (30 nm), $Fe_{0.9}Ga_{0.1}$ (1.5 nm), Mg (0.3 nm), $MgGa_2O_x$ (0.7 nm), $Fe_{0.9}Ga_{0.1}$ (1.5 nm), Fe (6 nm), IrMn (12 nm), and Ru (10 nm). In Example 1, the first ferromagnetic layer was a magnetization free layer, and the second ferromagnetic layer was a magnetization fixed layer.

The MR ratio and the RA of the magnetoresistance effect element of Example 1 were measured.

The MR ratio was measured as a change in the resistance value of the magnetoresistance effect element 10 while sweeping a magnetic field from the outside to a magnetoresistance effect element when a predetermined current was caused to flow in a lamination direction of the magnetoresistance effect element. The MR ratio was measured at 300 K (room temperature). The resistance value when the magnetization directions of the first ferromagnetic layer 1 and the second ferromagnetic layer 2 were parallel and the resistance value when the magnetization directions of the first ferromagnetic layer 1 and the second ferromagnetic layer 2 were antiparallel were measured, and the MR ratio was calculated from the obtained resistance values by the following formula.

MR ratio(%)=$(R_{AP}-R_P)/R_P \times 100$ $R_P$ was a resistance value when the magnetization directions of the first ferromagnetic layer 1 and the second ferromagnetic layer 2 were parallel, and $R_{AP}$ was a resistance value when the magnetization directions of the first ferromagnetic layer 1 and the second ferromagnetic layer 2 were antiparallel.

The RA was determined by a product of the resistance $R_P$ when the magnetization directions of the first ferromagnetic layer and the second ferromagnetic layer were parallel and an area of the magnetoresistance effect element in the in-plane direction.

The MR ratio of the magnetoresistance effect element of Example 1 was 70%, and the RA was 0.82 $\Omega\mu m^2$.

Example 2

Example 2 was different from Example 1 in that, when a nonmagnetic layer was formed, a Mg layer with a thickness of 0.3 nm and a $Mg(Al_{0.5}Ga_{0.5})_2O_x$ layer with a thickness of 0.7 nm were formed and annealed at 500° C. The other configurations were the same as those in Example 1.

A magnetoresistance effect element of Example 2 had a substrate, an underlayer, a first ferromagnetic layer, a first insertion layer, a nonmagnetic layer, a second insertion layer, a second ferromagnetic layer, an antiferromagnetic layer, and a cap layer. The configurations of respective layers during film formation were, in the above order, MgO(001), Cr (40 nm), Fe (30 nm), $Fe_{0.9}Ga_{0.1}$ (1.5 nm), Mg (0.3 nm), $Mg(Al_{0.5}Ga_{0.5})_2O_x$ (0.7 nm), $Fe_{0.9}Ga_{0.1}$ (1.5 nm), Fe (6 nm), IrMn (12 nm), and Ru (10 nm).

The MR ratio of the magnetoresistance effect element of Example 2 was 72%, and the RA was 0.94 $\Omega\mu m^2$.

Example 3

Example 3 was different from Example 1 in that a magnetostriction-reducing layer was formed after a second ferromagnetic layer was formed. The magnetostriction-reducing layer was a $Ni_{0.85}Fe_{0.15}$ layer with a thickness of 2 nm. The magnetostriction-reducing layer was formed and then annealed at 500° C. The other configurations were the same as those in Example 1.

A magnetoresistance effect element of Example 3 had a substrate, an underlayer, a first ferromagnetic layer, a first insertion layer, a nonmagnetic layer, a second insertion layer, a second ferromagnetic layer, a magnetostriction-reducing layer, an antiferromagnetic layer, and a cap layer. The configurations of respective layers during film formation were, in the above order, MgO(001), Cr (40 nm), Fe (30 nm), $Fe_{0.9}Ga_{0.1}$ (1.5 nm), Mg (0.3 nm), $MgGa_2O_x$ (0.7 nm), $Fe_{0.9}Ga_{0.1}$ (1.5 nm), Fe (6 nm), $Ni_{0.85}Fe_{0.15}$ (2 nm), IrMn (12 nm), and Ru (10 nm).

The MR ratio of the magnetoresistance effect element of Example 3 was 67%, and the RA was 0.8 $\Omega\mu m^2$.

Example 4

Example 4 was different from Example 2 in that a magnetostriction-reducing layer was formed after a second ferromagnetic layer was formed. The magnetostriction-reducing layer was a $Ni_{0.85}Fe_{0.15}$ layer with a thickness of 2 nm. The other configurations were the same as those in Example 2.

A magnetoresistance effect element of Example 4 had a substrate, an underlayer, a first ferromagnetic layer, a first insertion layer, a nonmagnetic layer, a second insertion layer, a second ferromagnetic layer, a magneto striction-reducing layer, an antiferromagnetic layer, and a cap layer. The configurations of respective layers during film formation were, in the above order, MgO(001), Cr (40 nm), Fe (30 nm), $Fe_{0.9}Ga_{0.1}$ (1.5 nm), Mg (0.3 nm), $Mg(Al_{0.5}Ga_{0.5})_2O_x$ (0.7 nm), $Fe_{0.9}Ga_{0.1}$ (1.5 nm), Fe (6 nm), $Ni_{0.85}Fe_{0.15}$ (2 nm), IrMn (12 nm), and Ru (10 nm).

The MR ratio of the magnetoresistance effect element of Example 4 was 70%, and the RA was 0.94 $\Omega\mu m^2$.

Example 5

Example 5 was different from Example 1 in that, when a first insertion layer and a second insertion layer were formed, a $Co_2FeGa_{0.5}Ge_{0.5}$ layer with a thickness of 1.5 nm was formed, and annealed at 300° C. The other configurations were the same as those in Example 1.

A magnetoresistance effect element of Example 5 had a substrate, an underlayer, a first ferromagnetic layer, a first insertion layer, a nonmagnetic layer, a second insertion layer, a second ferromagnetic layer, an antiferromagnetic layer, and a cap layer. The configurations of respective layers during film formation were, in the above order, MgO(001), Cr (40 nm), Fe (30 nm), $Co_2FeGa_{0.5}Ge_{0.5}$ (1.5 nm), Mg (0.3 nm), $MgGa_2O_x$ (0.7 nm), $Co_2FeGa_{0.5}Ge_{0.5}$ (1.5 nm), Fe (6 nm), IrMn (12 nm), and Ru (10 nm).

The MR ratio of the magnetoresistance effect element of Example 5 was 90%, and the RA was 0.81 $\Omega\mu m^2$.

Example 6

Example 6 was different from Example 2 in that, when a nonmagnetic layer was formed, if a first insertion layer and a second insertion layer were formed, a $Co_2FeGa_{0.5}Ge_{0.5}$ layer with a thickness of 1.5 nm was formed and annealed at 300° C. The other configurations were the same as those in Example 2.

A magnetoresistance effect element of Example 6 had a substrate, an underlayer, a first ferromagnetic layer, a first insertion layer, a nonmagnetic layer, a second insertion layer, a second ferromagnetic layer, an antiferromagnetic layer, and a cap layer. The configurations of respective layers during film formation were, in the above order, MgO(001), Cr (40 nm), Fe (30 nm), $Co_2FeGa_{0.5}Ge_{0.5}$ (1.5 nm), Mg (0.3 nm), $Mg(Al_{0.5}Ga_{0.5})_2O_x$ (0.7 nm), $Co_2FeGa_{0.5}Ge_{0.5}$ (1.5 nm), Fe (6 nm), IrMn (12 nm), and Ru (10 nm).

The MR ratio of the magnetoresistance effect element of Example 6 was 92%, and the RA was 0.93 $\Omega\mu m^2$.

Comparative Example 1

Comparative Example 1 was different from Example 1 in that no first insertion layer or second insertion layer was formed. The other configurations were the same as those in Example 1.

A magnetoresistance effect element of Comparative Example 1 had a substrate, an underlayer, a first ferromagnetic layer, a nonmagnetic layer, a second ferromagnetic layer, an antiferromagnetic layer, and a cap layer. The configurations of respective layers during film formation were, in the above order, MgO(001), Cr (40 nm), Fe (30 nm), Mg (0.3 nm), $MgGa_2O_x$ (0.7 nm), Fe (6 nm), IrMn (12 nm), and Ru (10 nm).

The MR ratio of the magnetoresistance effect element of Comparative Example 1 was 80%, and the RA was 1.31 $\Omega\mu m^2$.

Comparative Example 2

Comparative Example 2 was different from Example 2 in that no first insertion layer or second insertion layer was formed. The other configurations were the same as those in Example 2.

A magnetoresistance effect element of Comparative Example 2 had a substrate, an underlayer, a first ferromagnetic layer, a nonmagnetic layer, a second ferromagnetic layer, an antiferromagnetic layer, and a cap layer. The configurations of respective layers during film formation were, in the above order, MgO(001), Cr (40 nm), Fe (30 nm), Mg (0.3 nm), $Mg(Al_{0.5}Ga_{0.5})_2O_x$ (0.7 nm), Fe (6 nm), IrMn (12 nm), and Ru (10 nm).

The MR ratio of the magnetoresistance effect element of Comparative Example 2 was 85%, and the RA was 1.45 $\Omega\mu m^2$.

Table 1 shows summaries of conditions and results of the above Examples 1 to 6 and Comparative Examples 1 and 2. Table 1 shows the thicknesses of the layers in parentheses together with the compositions of the layers. The units of the thicknesses shown in Table 1 are all nm.

TABLE 1

|  | MR ratio (%) | RA ($\Omega\mu m^2$) | First ferromagnetic layer | First insertion layer | Nonmagnetic layer |
|---|---|---|---|---|---|
| Example 1 | 70 | 0.82 | Fe[30] | $Fe_{0.9}Ga_{0.1}$[1.5] | Mg[0.3]/$MgGa_2O_x$[0.7] |
| Example 2 | 72 | 0.94 | Fe[30] | $Fe_{0.9}Ga_{0.1}$[1.5] | Mg[0.3]/$Mg(Al_{0.5}Ga_{0.5})_2O_x$[0.7] |
| Example 3 | 67 | 0.8 | Fe[30] | $Fe_{0.9}Ga_{0.1}$[1.5] | Mg[0.3]/$MgGa_2O_x$[0.7] |
| Example 4 | 70 | 0.94 | Fe[30] | $Fe_{0.9}Ga_{0.1}$[1.5] | Mg[0.3]/$Mg(Al_{0.5}Ga_{0.5})_2O_x$[0.7] |
| Example 5 | 90 | 0.81 | Fe[30] | $Co_2FeGa_{0.5}Ge_{0.5}$[1.5] | Mg[0.3]/$MgGa_2O_x$[0.7] |
| Example 6 | 92 | 0.93 | Fe[30] | $Co_2FeGa_{0.5}Ge_{0.5}$[1.5] | Mg[0.3]/$Mg(Al_{0.5}Ga_{0.5})_2O_x$[0.7] |
| Comparative Example 1 | 80 | 1.31 | Fe[30] | — | Mg[0.3]/$MgGa_2O_x$[0.7] |
| Comparative Example 2 | 85 | 1.45 | Fe[30] | — | Mg[0.3]/$Mg(Al_{0.5}Ga_{0.5})_2O_x$[0.7] |

TABLE 1-continued

|  | Second insertion layer | Second ferromagnetic layer | Magnetostriction-reducing layer | Antiferromagnetic layer |
|---|---|---|---|---|
| Example 1 | $Fe_{0.9}Ga_{0.1}[1.5]$ | Fe[6] | — | IrMn[12] |
| Example 2 | $Fe_{0.9}Ga_{0.1}[1.5]$ | Fe[6] | — | IrMn[12] |
| Example 3 | $Fe_{0.9}Ga_{0.1}[1.5]$ | Fe[6] | $Ni_{0.85}Fe_{0.15}[2]$ | IrMn[12] |
| Example 4 | $Fe_{0.9}Ga_{0.1}[1.5]$ | Fe[6] | $Ni_{0.85}Fe_{0.15}[2]$ | IrMn[12] |
| Example 5 | $Co_2FeGa_{0.5}Ge_{0.5}[1.5]$ | Fe[6] | — | IrMn[12] |
| Example 6 | $Co_2FeGa_{0.5}Ge_{0.5}[1.5]$ | Fe[6] | — | IrMn[12] |
| Comparative Example 1 | — | Fe[6] | — | IrMn[12] |
| Comparative Example 2 | — | Fe[6] | — | IrMn[12] |

Example 7

On a Si substrate, an underlayer, an antiferromagnetic layer, a first ferromagnetic layer, and a first insertion layer were formed. Next, on the first insertion layer, a Mg layer with a thickness of 0.3 nm and a $MgGa_2O_x$ layer with a thickness of 0.7 nm were formed. Next, a second insertion layer, a second ferromagnetic layer, and a cap layer were formed thereon. Next, annealing was performed at 300° C. in a magnetic field of 15 kOe for 3 hours.

The underlayer was a Ta layer with a thickness of 2 nm and a Ru layer with a thickness of 2 nm in order from the side of the substrate. The antiferromagnetic layer was an IrMn layer with a thickness of 8.5 nm. The first ferromagnetic layer was a CoFe layer with a thickness of 3 nm, a Ru layer with a thickness of 0.8 nm and a CoFeB layer with a thickness of 1.5 nm in order from the side of the substrate. The first insertion layer was a $Co_{0.45}Fe_{0.45}Ga_{0.1}$ layer with a thickness of 1.5 nm.

A Mg layer with a thickness of 0.3 nm and a $MgGa_2O_x$ layer with a thickness of 0.7 nm formed on the first insertion layer were annealed and oxygen-diffused, and thus the Mg layer and the $MgGa_2O_x$ layer were combined into a nonmagnetic layer.

The second insertion layer was a $Co_{0.45}Fe_{0.45}Ga_{0.1}$ layer with a thickness of 1.5 nm and the second ferromagnetic layer was a CoFeB layer with a thickness of 1.5 nm. The cap layer was a Ta layer with a thickness of 5 nm and a Ru layer with a thickness of 10 nm.

A magnetoresistance effect element of Example 7 had a substrate, an underlayer, an antiferromagnetic layer, a first ferromagnetic layer, a first insertion layer, a nonmagnetic layer, a second insertion layer, a second ferromagnetic layer, and a cap layer. The configurations of respective layers during film formation were, in the above order, Si, Ta (2 nm), Ru (2 nm), IrMn (8.5 nm), CoFe (3 nm), Ru (0.8 nm), CoFeB (1.5 nm), $Co_{0.45}Fe_{0.45}Ga_{0.1}$ (1.5 nm), Mg (0.3 nm), $MgGa_2O_x$ (0.7 nm), $Co_{0.45}Fe_{0.45}Ga_{0.1}$ (1.5 nm), CoFeB (1.5 nm), Ta (5 nm), and Ru (10 nm). In Example 7, the first ferromagnetic layer was a magnetization fixed layer, and the second ferromagnetic layer was a magnetization free layer.

The MR ratio and the RA of the magnetoresistance effect element of Example 7 were measured. The MR ratio and the RA were measured in the same manner as in Example 1.

The MR ratio of the magnetoresistance effect element of Example 7 was 57%, and the RA was 0.88 $\Omega\mu m^2$.

Example 8

Example 8 was different from Example 7 in that, when a nonmagnetic layer was formed, a Mg layer with a thickness of 0.3 nm and a $Mg(Al_{0.5}Ga_{0.5})_2O_x$ layer with a thickness of 0.7 nm were formed. The other configurations were the same as those in Example 7.

A magnetoresistance effect element of Example 8 had a substrate, an underlayer, an antiferromagnetic layer, a first ferromagnetic layer, a first insertion layer, a nonmagnetic layer, a second insertion layer, a second ferromagnetic layer, and a cap layer. The configurations of respective layers during film formation were, in the above order, Si, Ta (2 nm), Ru (2 nm), IrMn (8.5 nm), CoFe (3 nm), Ru (0.8 nm), CoFeB (1.5 nm), $Co_{0.45}Fe_{0.45}Ga_{0.1}$ (1.5 nm), Mg (0.3 nm), $Mg(Al_{0.5}Ga_{0.5})_2O_x$ (0.7 nm), $Co_{0.45}Fe_{0.45}Ga_{0.1}$ (1.5 nm), CoFeB (1.5 nm), Ta (5 nm), and Ru (10 nm).

The MR ratio of the magnetoresistance effect element of Example 8 was 57%, and the RA was 0.92 $\Omega\mu m^2$.

Example 9

Example 9 was different from Example 7 in that, when a first insertion layer and a second insertion layer were formed, a $Co_2FeGa_{0.5}Ge_{0.5}$ layer with a thickness of 1.5 nm was formed. The other configurations were the same as those in Example 7.

A magnetoresistance effect element of Example 9 had a substrate, an underlayer, an antiferromagnetic layer, a first ferromagnetic layer, a first insertion layer, a nonmagnetic layer, a second insertion layer, a second ferromagnetic layer, and a cap layer. The configurations of respective layers during film formation were, in the above order, Si, Ta (2 nm), Ru (2 nm), IrMn (8.5 nm), CoFe (3 nm), Ru (0.8 nm), CoFeB (1.5 nm), $Co_2FeGa_{0.5}Ge_{0.5}$ (1.5 nm), Mg (0.3 nm), $MgGa_2O_x$ (0.7 nm), $Co_2FeGa_{0.5}Ge_{0.5}$ (1.5 nm), CoFeB (1.5 nm), Ta (5 nm), and Ru (10 nm).

The MR ratio of the magnetoresistance effect element of Example 9 was 84%, and the RA was 0.87 $\Omega\mu m^2$.

Example 10

Example 10 was different from Example 8 in that, when a first insertion layer and a second insertion layer were formed, a $Co_2FeGa_{0.5}Ge_{0.5}$ layer with a thickness of 1.5 nm was formed. The other configurations were the same as those in Example 8.

A magnetoresistance effect element of Example 10 had a substrate, an underlayer, an antiferromagnetic layer, a first ferromagnetic layer, a first insertion layer, a nonmagnetic layer, a second insertion layer, a second ferromagnetic layer, and a cap layer. The configurations of respective layers during film formation were, in the above order, Si, Ta (2 nm), Ru (2 nm), IrMn (8.5 nm), CoFe (3 nm), Ru (0.8 nm), CoFeB (1.5 nm), $Co_2FeGa_{0.5}Ge_{0.5}$ (1.5 nm), Mg (0.3 nm), Mg(Al$_{0.5}$Ga$_{0.5}$)$_2$O$_x$ (0.7 nm), Co$_2$FeGa$_{0.5}$Ge$_{0.5}$ (1.5 nm), CoFeB (1.5 nm), Ta (5 nm), and Ru (10 nm).

The MR ratio of the magnetoresistance effect element of Example 10 was 86%, and the RA was 0.92 Ωμm$^2$.

Example 11

Example 11 was different from Example 9 in that a first metal particle layer was formed after a first ferromagnetic layer was formed and a second metal particle layer was formed after a second insertion layer was formed. The other configurations were the same as those in Example 9.

A magnetoresistance effect element of Example 11 had a substrate, an underlayer, an antiferromagnetic layer, a first ferromagnetic layer, a first metal particle layer, a first insertion layer, a nonmagnetic layer, a second insertion layer, a second metal particle layer, a second ferromagnetic layer, and a cap layer. The configurations of respective layers during film formation were, in the above order, Si, Ta (2 nm), Ru (2 nm), IrMn (8.5 nm), CoFe (3 nm), Ru (0.8 nm), CoFeB (1.5 nm), W (0.6 nm), Co$_2$FeGa$_{0.5}$Ge$_{0.5}$ (1.5 nm), Mg (0.3 nm), MgGa$_2$O$_x$ (0.7 nm), Co$_2$FeGa$_{0.5}$Ge$_{0.5}$ (1.5 nm), W (0.6 nm), CoFeB (1.5 nm), Ta (5 nm), and Ru (10 nm).

The MR ratio of the magnetoresistance effect element of Example 11 was 90%, and the RA was 0.47 Ωμm$^2$.

Example 12

Example 12 was different from Example 10 in that a first metal particle layer was formed after a first ferromagnetic layer was formed and a second metal particle layer was formed after a second insertion layer was formed. The other configurations were the same as those in Example 10.

A magnetoresistance effect element of Example 12 had a substrate, an underlayer, an antiferromagnetic layer, a first ferromagnetic layer, a first metal particle layer, a first insertion layer, a nonmagnetic layer, a second insertion layer, a second metal particle layer, a second ferromagnetic layer, and a cap layer. The configurations of respective layers during film formation were, in the above order, Si, Ta (2 nm), Ru (2 nm), IrMn (8.5 nm), CoFe (3 nm), Ru (0.8 nm), CoFeB (1.5 nm), W (0.6 nm), Co$_2$FeGa$_{0.5}$Ge$_{0.5}$ (1.5 nm), Mg (0.3 nm), Mg(Al$_{0.5}$Ga$_{0.5}$)$_2$O$_x$ (0.7 nm), Co$_2$FeGa$_{0.5}$Ge$_{0.5}$ (1.5 nm), W (0.6 nm), CoFeB (1.5 nm), Ta (5 nm), and Ru (10 nm).

The MR ratio of the magnetoresistance effect element of Example 12 was 94%, and the RA was 0.51.

Comparative Example 3

Comparative Example 3 was different from Example 7 in that no first insertion layer or second insertion layer was formed, and the thicknesses of the first ferromagnetic layer and the second ferromagnetic layer were changed. The other configurations were the same as those in Example 7.

A magnetoresistance effect element of Comparative Example 3 had a substrate, an underlayer, an antiferromagnetic layer, a first ferromagnetic layer, a nonmagnetic layer, a second ferromagnetic layer, and a cap layer. The configurations of respective layers during film formation were, in the above order, Si, Ta (2 nm), Ru (2 nm), IrMn (8.5 nm), CoFe (3 nm), Ru (0.8 nm), CoFeB (3 nm), Mg (0.3 nm), MgGa$_2$O$_x$ (0.7 nm), CoFeB (3 nm), Ta (5 nm), and Ru (10 nm).

The MR ratio of the magnetoresistance effect element of Comparative Example 3 was 70%, and the RA was 1.41 Ωμm$^2$.

Comparative Example 4

Comparative Example 4 was different from Example 8 in that no first insertion layer or second insertion layer was formed and the thicknesses of the first ferromagnetic layer and the second ferromagnetic layer were changed. The other configurations were the same as those in Example 8.

A magnetoresistance effect element of Comparative Example 4 had a substrate, an underlayer, an antiferromagnetic layer, a first ferromagnetic layer, a nonmagnetic layer, a second ferromagnetic layer, and a cap layer. The configurations of respective layers during film formation were, in the above order, Si, Ta (2 nm), Ru (2 nm), IrMn (8.5 nm), CoFe (3 nm), Ru (0.8 nm), CoFeB (3 nm), Mg (0.3 nm), Mg(Al$_{0.5}$Ga$_{0.5}$)$_2$O$_x$ (0.7 nm), CoFeB (3 nm), Ta (5 nm), and Ru (10 nm).

The MR ratio of the magnetoresistance effect element of Comparative Example 4 was 73%, and the RA was 1.52 Ωμm$^2$.

Table 2 shows summaries of conditions and results of the above Examples 7 to 12 and Comparative Examples 3 and 4. Table 2 shows the thicknesses of the layers together with the compositions of the layers. The units of the thicknesses shown in Table 1 are all nm. The units of the thicknesses shown in Table 2 are all nm.

TABLE 2

| | MR ratio (%) | RA (Ωμm$^2$) | Antiferromagnetic layer | First ferromagnetic layer | First metal particle layer | First insertion layer |
|---|---|---|---|---|---|---|
| Example 7 | 57 | 0.88 | IrMn[8.5] | CoFe[3]/Ru[0.8]/CoFeB[1.5] | — | Co$_{0.45}$Fe$_{0.45}$Ga$_{0.1}$[1.5] |
| Example 8 | 57 | 0.92 | IrMn[8.5] | CoFe[3]/Ru[0.8]/CoFeB[1.5] | — | Co$_{0.45}$Fe$_{0.45}$Ga$_{0.1}$[1.5] |
| Example 9 | 84 | 0.87 | IrMn[8.5] | CoFe[3]/Ru[0.8]/CoFeB[1.5] | — | Co$_2$FeGa$_{0.5}$Ge$_{0.5}$[1.5] |
| Example 10 | 86 | 0.92 | IrMn[8.5] | CoFe[3]/Ru[0.8]/CoFeB[1.5] | — | Co$_2$FeGa$_{0.5}$Ge$_{0.5}$[1.5] |
| Example 11 | 90 | 0.47 | IrMn[8.5] | CoFe[3]/Ru[0.8]/CoFeB[1.5] | W[0.6] | Co$_2$FeGa$_{0.5}$Ge$_{0.5}$[1.5] |
| Example 12 | 94 | 0.51 | IrMn[8.5] | CoFe[3]/Ru[0.8]/CoFeB[1.5] | W[0.6] | Co$_2$FeGa$_{0.5}$Ge$_{0.5}$[1.5] |
| Comparative Example 3 | 70 | 1.41 | IrMn[8.5] | CoFe[3]/Ru[0.8]/CoFeB[3] | — | — |
| Comparative Example 4 | 73 | 1.52 | IrMn[8.5] | CoFe[3]/Ru[0.8]/CoFeB[3] | — | — |

TABLE 2-continued

|  | Nonmagnetic layer | Second insertion layer | Second metal particle layer | Second ferromagnetic layer |
|---|---|---|---|---|
| Example 7 | Mg[0.3]/MgGa$_2$O$_x$[0.7] | Co$_{0.45}$Fe$_{0.45}$Ga$_{0.1}$[1.5] | — | CoFeB[1.5] |
| Example 8 | Mg[0.3]/Mg(Al$_{0.5}$Ga$_{0.5}$)$_2$O$_x$[0.7] | Co$_{0.45}$Fe$_{0.45}$Ga$_{0.1}$[1.5] | — | CoFeB[1.5] |
| Example 9 | Mg[0.3]/MgGa$_2$O$_x$[0.7] | Co$_2$FeGa$_{0.5}$Ge$_{0.5}$[1.5] | — | CoFeB[1.5] |
| Example 10 | Mg[0.3]/Mg(Al$_{0.5}$Ga$_{0.5}$)$_2$O$_x$[0.7] | Co$_2$FeGa$_{0.5}$Ge$_{0.5}$[1.5] | — | CoFeB[1.5] |
| Example 11 | Mg[0.3]/MgGa$_2$O$_x$[0.7] | Co$_2$FeGa$_{0.5}$Ge$_{0.5}$[1.5] | W[0.6] | CoFeB[1.5] |
| Example 12 | Mg[0.3]/Mg(Al$_{0.5}$Ga$_{0.5}$)$_2$O$_x$[0.7] | Co$_2$FeGa$_{0.5}$Ge$_{0.5}$[1.5] | W[0.6] | CoFeB[1.5] |
| Comparative Example 3 | Mg[0.3]/MgGa$_2$O$_x$[0.7] | — | — | CoFeB[3] |
| Comparative Example 4 | Mg[0.3]/Mg(Al$_{0.5}$Ga$_{0.5}$)$_2$O$_x$[0.7] | — | — | CoFeB[3] |

What is claimed is:

1. A magnetoresistance effect element, comprising:
a first ferromagnetic layer;
a second ferromagnetic layer;
a nonmagnetic layer that is disposed between the first ferromagnetic layer and the second ferromagnetic layer; and
an insertion layer that is disposed at least one of a position between the first ferromagnetic layer and the nonmagnetic layer and a position between the second ferromagnetic layer and the nonmagnetic layer,
wherein the nonmagnetic layer is composed of an oxide containing Mg and Ga,
wherein the insertion layer is a ferromagnetic component containing Ga, and
wherein a Ga concentration of the insertion layer is lower than a Ga concentration of the nonmagnetic layer.

2. The magnetoresistance effect element according to claim 1,
wherein the nonmagnetic layer is composed of an oxide containing Mg, Al, and Ga.

3. The magnetoresistance effect element according to claim 1,
wherein the thickness of the insertion layer is 2 nm or less.

4. The magnetoresistance effect element according to claim 1,
wherein the insertion layer, the first ferromagnetic layer, and the second ferromagnetic layer contain at least one element of Co and Fe.

5. The magnetoresistance effect element according to claim 1,
wherein the insertion layer includes a first insertion layer and a second insertion layer,
the first insertion layer is disposed at the position between the first ferromagnetic layer and the nonmagnetic layer,
the second insertion layer is disposed at the position between the second ferromagnetic layer and the nonmagnetic layer, and
a Ga concentration of the first insertion layer and the second insertion layer decreases away from the nonmagnetic layer in a lamination direction or a direction opposite to the lamination direction.

6. The magnetoresistance effect element according to claim 1,
wherein the insertion layer contains a Heusler alloy containing Ga.

7. The magnetoresistance effect element according to claim 6,
wherein the Heusler alloy is an alloy represented by the following General Formula (1):

$$Co_2Fe_\alpha Ga_\beta Ge_\gamma \qquad (1)$$

(in Formula (1), α, β and γ represent numbers that satisfy 2.3≤α+β+γ, α≤β+γ, and 0.5<α<1.9, 0.1≤β, and 0.1≤γ).

8. The magnetoresistance effect element according to claim 1, further comprising:
a metal particle layer that is disposed at least one of a position between the insertion layer and the first ferromagnetic layer and a position between the insertion layer and the second ferromagnetic layer,
wherein the metal particle layer contains any one element selected from among Ta, W, and Mo.

9. The magnetoresistance effect element according to claim 8,
wherein the thickness of the metal particle layer is 1 nm or less.

10. The magnetoresistance effect element according to claim 8,
wherein the thickness of the metal particle layer is 0.01 nm or more.

11. The magnetoresistance effect element according to claim 1, further comprising:
a magnetostriction-reducing layer that exhibits magnetostriction in a direction opposite to that of the insertion layer at any position in a lamination direction.

12. The magnetoresistance effect element according to claim 11, wherein the magnetostriction-reducing layer is adjacent to the insertion layer.

13. The magnetoresistance effect element according to claim 11,
wherein the magnetostriction-reducing layer is composed of SmFe, ErFe$_2$, TmFe$_2$, or CoSiB.

* * * * *